:::
United States Patent [19]
Debord et al.

[11] Patent Number: 4,961,193
[45] Date of Patent: Oct. 2, 1990

[54] EXTENDED ERRORS CORRECTING DEVICE HAVING SINGLE PACKAGE ERROR CORRECTING AND DOUBLE PACKAGE ERROR DETECTING CODES

[75] Inventors: Pierre Debord, Tourrettes sur Loup; Rene Glaise, Nice, both of France

[73] Assignee: International Business Machines, Armong, N.Y.

[21] Appl. No.: 276,583

[22] Filed: Nov. 28, 1988

[30] Foreign Application Priority Data

Apr. 29, 1988 [EP] European Pat. Off. ........ 88480012.9

[51] Int. Cl.$^5$ ............................................. G06F 11/10
[52] U.S. Cl. ................................... 371/37.2; 371/38.1; 371/40.1
[58] Field of Search ...................... 371/37.2, 38.1, 40.1

[56] References Cited

U.S. PATENT DOCUMENTS

| | | | |
|---|---|---|---|
| 4,464,753 | 8/1984 | Chen | 371/40.1 |
| 4,661,955 | 4/1987 | Arlington et al. | 371/13 |
| 4,862,463 | 8/1989 | Chen | 371/40.1 |

FOREIGN PATENT DOCUMENTS

| | | |
|---|---|---|
| 0188192 | 7/1982 | European Pat. Off. |
| 0107038 | 5/1984 | European Pat. Off. |
| 0186719 | 7/1986 | European Pat. Off. |
| WO83/02345 | 7/1983 | PCT Int'l Appl. |

OTHER PUBLICATIONS

Aichelmann, Jr., Fault-Tolerant Design Techniques for Semiconductor Memory Applications, IBM J. Res. Develop., vol. 28, No. 2, Mar. 1984, pp. 177–183.

Reddy, A Class of Linear Codes for Error Control in Byte-per-Card Organized Digital Systems, IEEE, 1978, pp. 455–459.

Chen, SEC-DED Codes with Package Error Detection Capability, IBM Tech. Discl. Bulletin, vol. 22, No. 6, Nov. 1979, pp. 2356–2359.

*Primary Examiner*—Charles E. Atkinson
*Attorney, Agent, or Firm*—Lawrence D. Cutter

[57] ABSTRACT

An apparatus and method for correcting data words from a memory is provided in which coded data is divided into a plurality of multi-bit packages of b bits each. The coded data comprises n-bit words with r error correcting code bits and n-r data bits. The invention is capable of correcting one package which has suffered at least one hard failure and a single soft error located in a different package. The invention involves the use of an error correcting code which gives a first syndrome when the data word has suffered a first error coming from at least one error in a first package and a single error in a different second package, which also gives a second syndrome when the data word has suffered a second error coming from at least one error in the above first package, and a single error in a third package. The error correcting code is such that equality of the first and second syndromes results in the equality of the first and second errors.

17 Claims, 14 Drawing Sheets

:::

| | SYNDROMES OF DOUBLE PACKAGE ERRORS WHEN A PACKAGE ERROR IS ALIGNED WITH A SINGLE BIT ERROR | | | | | | | | | | | | | | |
|---|---|---|---|---|---|---|---|---|---|---|---|---|---|---|---|
| | Bits in Error within the package in HexaDecimal notation: | | | | | | | | | | | | | | |
| | 1 | 2 | 3 | 4 | 5 | 6 | 7 | 8 | 9 | A | B | C | D | E | F |
| P S 1 5 | 953 | A60 | B71 | C06 | D17 | E24 | F35 | 0CA | 1DB | 2E8 | 3F9 | 48E | 59F | 6AC | 7BD |
| A I 1 6 | 530 | 603 | 712 | 065 | 174 | 247 | 356 | CA9 | DB8 | E8B | F9A | 8ED | 9FC | ACF | BDE |
| C N 1 7 | 30D | 03E | 12F | 658 | 749 | 47A | 56B | A94 | B85 | 8B6 | 9A7 | ED0 | FC1 | CF2 | DE3 |
| K G 1 8 | 0D7 | 3E4 | 2F5 | 582 | 493 | 7A0 | 6B1 | 94E | 85F | B6C | A7D | D0A | C1B | F28 | E39 |
| A L 1 9 | 93D | A0E | B1F | C68 | D79 | E4A | F5B | 0A4 | 1B5 | 286 | 397 | 4E0 | 5F1 | 6C2 | 7D3 |
| G E 1 10 | 507 | 634 | 725 | 052 | 143 | 270 | 361 | C9E | D8F | EBC | FAD | 8DA | 9CB | AF8 | BE9 |
| E 1 11 | 3D2 | 0E1 | 1F0 | 687 | 796 | 4A5 | 5B4 | A4B | B5A | 869 | 978 | E0F | F1E | C2D | D3C |
| E 1 12 | 07C | 34F | 25E | 529 | 438 | 70B | 61A | 9E5 | 8F4 | BC7 | AD6 | DA1 | CB0 | F83 | E92 |
| N R 1 13 | 902 | A31 | B20 | C57 | D46 | E75 | F64 | 09B | 18A | 2B9 | 3A8 | 4DF | 5CE | 6FD | 7EC |
| B R 1 14 | 5DC | 6EF | 7FE | 089 | 198 | 2AB | 3BA | C45 | D54 | E67 | F76 | 801 | 910 | A23 | B32 |
| O 1 15 | 37B | 048 | 159 | 62E | 73F | 40C | 51D | AE2 | BF3 | 8C0 | 9D1 | EA6 | FB7 | C84 | D95 |
| O R 1 16 | 024 | 317 | 206 | 571 | 460 | 753 | 642 | 9BD | 8AC | B9F | A8E | DF9 | CE8 | FDB | ECA |
| N 1 17 | 9DB | AE8 | BF9 | C8E | D9F | EAC | FBD | 042 | 153 | 260 | 371 | 406 | 517 | 624 | 735 |
| L 1 18 | 574 | 647 | 756 | 021 | 130 | 203 | 312 | CED | DFC | ECF | FDE | 8A9 | 9B8 | A8B | B9A |
| T O 1 19 | 32F | 01C | 10D | 67A | 76B | 458 | 549 | AB6 | BA7 | 894 | 985 | EF2 | FE3 | CD0 | DC1 |
| H C 1 20 | 0C6 | 3F5 | 2E4 | 593 | 482 | 7B1 | 6A0 | 95F | 84E | B7D | A6C | D1B | C0A | F39 | E28 |
| E A 1 21 | 97F | A4C | B5D | C2A | D3B | E08 | F19 | 0E6 | 1F7 | 2C4 | 3D5 | 4A2 | 5B3 | 680 | 791 |
| T 1 22 | 526 | 615 | 704 | 073 | 162 | 251 | 340 | CBF | DAE | E9D | F8C | 8FB | 9EA | AD9 | BC8 |
| I 1 23 | 3CE | 0FD | 1EC | 69B | 78A | 4B9 | 5A8 | A57 | B46 | 875 | 964 | E13 | F02 | C31 | D20 |
| L O 1 24 | 0BA | 389 | 298 | 5EF | 4FE | 7CD | 6DC | 923 | 832 | B01 | A10 | D67 | C76 | F45 | E54 |
| E N 1 25 | 92E | A1D | B0C | C7B | D6A | E59 | F48 | 0B7 | 1A6 | 295 | 384 | 4F3 | 5E2 | 6D1 | 7C0 |
| F 1 26 | 5CA | 6F9 | 7E8 | 09F | 18E | 2BD | 3AC | C53 | D42 | E71 | F60 | 817 | 906 | A35 | B24 |
| T O 1 27 | 3B8 | 08B | 19A | 6ED | 7FC | 4CF | 5DE | A21 | B30 | 803 | 912 | E65 | F74 | C47 | D56 |
| N 1 28 | 049 | 37A | 26B | 51C | 40D | 73E | 62F | 9D0 | 8C1 | BF2 | AE3 | D94 | C85 | FB6 | EA7 |
| 1 29 | 9C8 | AFB | BEA | C9D | D8C | EBF | FAE | 051 | 140 | 273 | 362 | 415 | 504 | 637 | 726 |
| T 1 30 | 5B9 | 68A | 79B | 0EC | 1FD | 2CE | 3DF | C20 | D31 | E02 | F13 | 864 | 975 | A46 | B57 |
| H 1 31 | 345 | 076 | 167 | 610 | 701 | 432 | 523 | ADC | BCD | 8FE | 9EF | E98 | F89 | CBA | DAB |
| E 1 32 | 0F3 | 3C0 | 2D1 | 5A6 | 4B7 | 784 | 695 | 96A | 87B | B48 | A59 | D2E | C3F | F0C | E1D |
| 1 33 | 911 | A22 | B33 | C44 | D55 | E66 | F77 | 088 | 199 | 2AA | 3BB | 4CC | 5DD | 6EE | 7FF |
| R 1 34 | 511 | 622 | 733 | 044 | 155 | 266 | 377 | C88 | D99 | EAA | FBB | 8CC | 9DD | AEE | BFF |
| I 1 35 | 311 | 022 | 133 | 644 | 755 | 466 | 577 | A88 | B99 | 8AA | 9BB | ECC | FDD | CEE | DFF |
| G 1 36 | 011 | 322 | 233 | 544 | 455 | 766 | 677 | 988 | 899 | BAA | ABB | DCC | CDD | FEE | EFF |
| H 1 37 | 191 | 2A2 | 3B3 | 4C4 | 5D5 | 6E6 | 7F7 | 808 | 919 | A2A | B3B | C4C | D5D | E6E | F7F |
| T 1 38 | 151 | 262 | 373 | 404 | 515 | 626 | 737 | 8C8 | 9D9 | AEA | BFB | C8C | D9D | EAE | FBF |
| 1 39 | 131 | 202 | 313 | 464 | 575 | 646 | 757 | 8A8 | 9B9 | A8A | B9B | CEC | DFD | ECE | FDF |
| 1 40 | 101 | 232 | 323 | 454 | 545 | 676 | 767 | 898 | 989 | ABA | BAB | CDC | DCD | EFE | FEF |
| 1 41 | 119 | 22A | 33B | 44C | 55D | 66E | 77F | 880 | 991 | AA2 | BB3 | CC4 | DD5 | EE6 | FF7 |
| 1 42 | 115 | 226 | 337 | 440 | 551 | 662 | 773 | 88C | 99D | AAE | BBF | CC8 | DD9 | EEA | FFB |
| 1 43 | 113 | 220 | 331 | 446 | 557 | 664 | 775 | 88A | 99B | AA8 | BB9 | CCE | DDF | EEC | FFD |
| 1 44 | 110 | 223 | 332 | 445 | 554 | 667 | 776 | 889 | 998 | AAB | BBA | CCD | DDC | EEF | FFE |

FIG. 1

| | | SYNDROMES OF DOUBLE PACKAGE ERRORS WHEN A PACKAGE ERROR IS ALIGNED WITH A SINGLE BIT ERROR | | | | | | | | | | | | | |
|---|---|---|---|---|---|---|---|---|---|---|---|---|---|---|---|
| | | Bits in Error within the package in HexaDecimal notation: | | | | | | | | | | | | | |
| | | 1 | 2 | 3 | 4 | 5 | 6 | 7 | 8 | 9 | A | B | C | D | E | F |
| 2 | 1 | 94E | A94 | B52 | CA9 | D6F | EB5 | F73 | 0CA | 10C | 2D6 | 310 | 4EB | 52D | 6F7 | 731 |
| 2 | 2 | 582 | 658 | 79E | 065 | 1A3 | 279 | 3BF | C06 | DC0 | E1A | FDC | 827 | 9E1 | A3B | BFD |
| 2 | 3 | 3E4 | 03E | 1F8 | 603 | 7C5 | 41F | 5D9 | A60 | BA6 | 87C | 9BA | E41 | F87 | C5D | D9B |
| 2 | 4 | 0D7 | 30D | 2CB | 530 | 4F6 | 72C | 6EA | 953 | 895 | B4F | A89 | D72 | CB4 | F6E | EA8 |
| 2 | 9 | 9EA | A30 | BF6 | C0D | DCB | E11 | FD7 | 06E | 1A8 | 272 | 3B4 | 44F | 589 | 653 | 795 |
| 2 | 10 | 5D0 | 60A | 7CC | 037 | 1F1 | 22B | 3ED | C54 | D92 | E48 | F8E | 875 | 9B3 | A69 | BAF |
| 2 | 11 | 305 | 0DF | 119 | 6E2 | 724 | 4FE | 538 | A81 | B47 | 89D | 95B | EA0 | F66 | CBC | D7A |
| 2 | 12 | 0AB | 371 | 2B7 | 54C | 48A | 750 | 696 | 92F | 8E9 | B33 | AF5 | D0E | CC8 | F12 | ED4 |
| 2 | 13 | 9D5 | A0F | BC9 | C32 | DF4 | E2E | FE8 | 051 | 197 | 24D | 38B | 470 | 5B6 | 66C | 7AA |
| 2 | 14 | 50B | 6D1 | 717 | 0EC | 12A | 2F0 | 336 | C8F | D49 | E93 | F55 | 8AE | 968 | AB2 | B74 |
| 2 | 15 | 3AC | 076 | 1B0 | 64B | 78D | 457 | 591 | A28 | BEE | 834 | 9F2 | E09 | FCF | C15 | DD3 |
| 2 | 16 | 0F3 | 329 | 2EF | 514 | 4D2 | 708 | 6CE | 977 | 8B1 | B6B | AAD | D56 | C90 | F4A | E8C |
| 2 | 17 | 90C | AD6 | B10 | CEB | D2D | EF7 | F31 | 088 | 14E | 294 | 352 | 4A9 | 56F | 6B5 | 773 |
| 2 | 18 | 5A3 | 679 | 7BF | 044 | 182 | 258 | 39E | C27 | DE1 | E3B | FFD | 806 | 9C0 | A1A | BDC |
| 2 | 19 | 3F8 | 022 | 1E4 | 61F | 7D9 | 403 | 5C5 | A7C | BBA | 860 | 9A6 | E5D | F9B | C41 | D87 |
| 2 | 20 | 011 | 3CB | 20D | 5F6 | 430 | 7EA | 62C | 995 | 853 | B89 | A4F | DB4 | C72 | FA8 | E6E |
| 2 | 21 | 9A8 | A72 | BB4 | C4F | D89 | E53 | F95 | 02C | 1EA | 230 | 3F6 | 40D | 5CB | 611 | 7D7 |
| 2 | 22 | 5F1 | 62B | 7ED | 016 | 1D0 | 20A | 3CC | C75 | DB3 | E69 | FAF | 854 | 992 | A48 | B8E |
| 2 | 23 | 319 | 0C3 | 105 | 6FE | 738 | 4E2 | 524 | A9D | B5B | 881 | 947 | EBC | F7A | CA0 | D66 |
| 2 | 24 | 06D | 3B7 | 271 | 58A | 44C | 796 | 650 | 9E9 | 82F | BF5 | A33 | DC8 | C0E | FD4 | E12 |
| 2 | 25 | 9F9 | A23 | BE5 | C1E | DD8 | E02 | FC4 | 07D | 1BB | 261 | 3A7 | 45C | 59A | 640 | 786 |
| 2 | 26 | 51D | 6C7 | 701 | 0FA | 13C | 2E6 | 320 | C99 | D5F | E85 | F43 | 8B8 | 97E | AA4 | B62 |
| 2 | 27 | 36F | 0B5 | 173 | 688 | 74E | 494 | 552 | AEB | B2D | 8F7 | 931 | ECA | F0C | CD6 | D10 |
| 2 | 28 | 09E | 344 | 282 | 579 | 4BF | 765 | 6A3 | 91A | 8DC | B06 | AC0 | D3B | CFD | F27 | EE1 |
| 2 | 29 | 91F | AC5 | B03 | CF8 | D3E | EE4 | F22 | 09B | 15D | 287 | 341 | 4BA | 57C | 6A6 | 760 |
| 2 | 30 | 56E | 6B4 | 772 | 089 | 14F | 295 | 353 | CEA | D2C | EF6 | F30 | 8CB | 90D | AD7 | B11 |
| 2 | 31 | 392 | 048 | 18E | 675 | 7B3 | 469 | 5AF | A16 | BD0 | 80A | 9CC | E37 | FF1 | C2B | DED |
| 2 | 32 | 024 | 3FE | 238 | 5C3 | 405 | 7DF | 619 | 9A0 | 866 | BBC | A7A | D81 | C47 | F9D | E5B |
| 2 | 33 | 9C6 | A1C | BDA | C21 | DE7 | E3D | FFB | 042 | 184 | 25E | 398 | 463 | 5A5 | 67F | 7B9 |
| 2 | 34 | 5C6 | 61C | 7DA | 021 | 1E7 | 23D | 3FB | C42 | D84 | E5E | F98 | 863 | 9A5 | A7F | BB9 |
| 2 | 35 | 3C6 | 01C | 1DA | 621 | 7E7 | 43D | 5FB | A42 | B84 | 85E | 998 | E63 | FA5 | C7F | DB9 |
| 2 | 36 | 0C6 | 31C | 2DA | 521 | 4E7 | 73D | 6FB | 942 | 884 | B5E | A98 | D63 | CA5 | F7F | EB9 |
| 2 | 37 | 146 | 29C | 35A | 4A1 | 567 | 6BD | 77B | 8C2 | 904 | ADE | B18 | CE3 | D25 | EFF | F39 |
| 2 | 38 | 186 | 25C | 39A | 461 | 5A7 | 67D | 7BB | 802 | 9C4 | A1E | BD8 | C23 | DE5 | E3F | FF9 |
| 2 | 39 | 1E6 | 23C | 3FA | 401 | 5C7 | 61D | 7DB | 862 | 9A4 | A7E | BB8 | C43 | D85 | E5F | F99 |
| 2 | 40 | 1D6 | 20C | 3CA | 431 | 5F7 | 62D | 7EB | 852 | 994 | A4E | B88 | C73 | DB5 | E6F | FA9 |
| 2 | 41 | 1CE | 214 | 3D2 | 429 | 5EF | 635 | 7F3 | 84A | 98C | A56 | B90 | C6B | DAD | E77 | FB1 |
| 2 | 42 | 1C2 | 218 | 3DE | 425 | 5E3 | 639 | 7FF | 846 | 980 | A5A | B9C | C67 | DA1 | E7B | FBD |
| 2 | 43 | 1C4 | 21E | 3D8 | 423 | 5E5 | 63F | 7F9 | 840 | 986 | A5C | B9A | C61 | DA7 | E7D | FBB |
| 2 | 44 | 1C7 | 21D | 3DB | 420 | 5E6 | 63C | 7FA | 843 | 985 | A5F | B99 | C62 | DA4 | E7E | FB8 |

FIG. 2

|   |   | Bits in Error within the package in HexaDecimal notation: | | | | | | | | | | | | | |
|---|---|---|---|---|---|---|---|---|---|---|---|---|---|---|---|
|   |   | 1 | 2 | 3 | 4 | 5 | 6 | 7 | 8 | 9 | A | B | C | D | E | F |
| 3 | 1 | 9E5 | A4B | B26 | C9E | DF3 | E5D | F30 | 0A4 | 1C9 | 267 | 30A | 4B2 | 5DF | 671 | 71C |
| 3 | 2 | 529 | 687 | 7EA | 052 | 13F | 291 | 3FC | C68 | D05 | EAB | FC6 | 87E | 913 | ABD | BD0 |
| 3 | 3 | 34F | 0E1 | 18C | 634 | 759 | 4F7 | 59A | A0E | B63 | 8CD | 9A0 | E18 | F75 | CDB | DB6 |
| 3 | 4 | 07C | 3D2 | 2BF | 507 | 46A | 7C4 | 6A9 | 93D | 850 | BFE | A93 | D2B | C46 | FE8 | E85 |
| 3 | 5 | 92F | A81 | BEC | C54 | D39 | E97 | FFA | 06E | 103 | 2AD | 3C0 | 478 | 515 | 6BB | 7D6 |
| 3 | 6 | 54C | 6E2 | 78F | 037 | 15A | 2F4 | 399 | C0D | D60 | ECE | FA3 | 81B | 976 | AD8 | BB5 |
| 3 | 7 | 371 | 0DF | 1B2 | 60A | 767 | 4C9 | 5A4 | A30 | B5D | 8F3 | 99E | E26 | F4B | CE5 | D88 |
| 3 | 8 | 0AB | 305 | 268 | 5D0 | 4BD | 713 | 67E | 9EA | 887 | B29 | A44 | DFC | C91 | F3F | E52 |
| 3 | 13 | 97E | AD0 | BBD | C05 | D68 | EC6 | FAB | 03F | 152 | 2FC | 391 | 429 | 544 | 6EA | 787 |
| 3 | 14 | 5A0 | 60E | 763 | 0DB | 1B6 | 218 | 375 | CE1 | D8C | E22 | F4F | 8F7 | 99A | A34 | B59 |
| 3 | 15 | 307 | 0A9 | 1C4 | 67C | 711 | 4BF | 5D2 | A46 | B2B | 885 | 9E8 | E50 | F3D | C93 | DFE |
| 3 | 16 | 058 | 3F6 | 29B | 523 | 44E | 7E0 | 68D | 919 | 874 | BDA | AB7 | D0F | C62 | FCC | EA1 |
| 3 | 17 | 9A7 | A09 | B64 | CDC | DB1 | E1F | F72 | 0E6 | 18B | 225 | 348 | 4F0 | 59D | 633 | 75E |
| 3 | 18 | 508 | 6A6 | 7CB | 073 | 11E | 2B0 | 3DD | C49 | D24 | E8A | FE7 | 85F | 932 | A9C | BF1 |
| 3 | 19 | 353 | 0FD | 190 | 628 | 745 | 4EB | 586 | A12 | B7F | 8D1 | 9BC | E04 | F69 | CC7 | DAA |
| 3 | 20 | 0BA | 314 | 279 | 5C1 | 4AC | 702 | 66F | 9FB | 896 | B38 | A55 | DED | C80 | F2E | E43 |
| 3 | 21 | 903 | AAD | BC0 | C78 | D15 | EBB | FD6 | 042 | 12F | 281 | 3EC | 454 | 539 | 697 | 7FA |
| 3 | 22 | 55A | 6F4 | 799 | 021 | 14C | 2E2 | 38F | C1B | D76 | ED8 | FB5 | 80D | 960 | ACE | BA3 |
| 3 | 23 | 3B2 | 01C | 171 | 6C9 | 7A4 | 40A | 567 | AF3 | B9E | 830 | 95D | EE5 | F88 | C26 | D4B |
| 3 | 24 | 0C6 | 368 | 205 | 5BD | 4D0 | 77E | 613 | 987 | 8EA | B44 | A29 | D91 | CFC | F52 | E3F |
| 3 | 25 | 952 | AFC | B91 | C29 | D44 | EEA | F87 | 013 | 17E | 2D0 | 3BD | 405 | 568 | 6C6 | 7AB |
| 3 | 26 | 5B6 | 618 | 775 | 0CD | 1A0 | 20E | 363 | CF7 | D9A | E34 | F59 | 8E1 | 98C | A22 | B4F |
| 3 | 27 | 3C4 | 06A | 107 | 6BF | 7D2 | 47C | 511 | A85 | BE8 | 846 | 92B | E93 | FFE | C50 | D3D |
| 3 | 28 | 035 | 39B | 2F6 | 54E | 423 | 78D | 6E0 | 974 | 819 | BB7 | ADA | D62 | C0F | FA1 | ECC |
| 3 | 29 | 9B4 | A1A | B77 | CCF | DA2 | E0C | F61 | 0F5 | 198 | 236 | 35B | 4E3 | 58E | 620 | 74D |
| 3 | 30 | 5C5 | 66B | 706 | 0BE | 1D3 | 27D | 310 | C84 | DE9 | E47 | F2A | 892 | 9FF | A51 | B3C |
| 3 | 31 | 339 | 097 | 1FA | 642 | 72F | 481 | 5EC | A78 | B15 | 8BB | 9D6 | E6E | F03 | CAD | DC0 |
| 3 | 32 | 08F | 321 | 24C | 5F4 | 499 | 737 | 65A | 9CE | 8A3 | B0D | A60 | DD8 | CB5 | F1B | E76 |
| 3 | 33 | 96D | AC3 | BAE | C16 | D7B | ED5 | FB8 | 02C | 141 | 2EF | 382 | 43A | 557 | 6F9 | 794 |
| 3 | 34 | 56D | 6C3 | 7AE | 016 | 17B | 2D5 | 3B8 | C2C | D41 | EEF | F82 | 83A | 957 | AF9 | B94 |
| 3 | 35 | 36D | 0C3 | 1AE | 616 | 77B | 4D5 | 5B8 | A2C | B41 | 8EF | 982 | E3A | F57 | CF9 | D94 |
| 3 | 36 | 06D | 3C3 | 2AE | 516 | 47B | 7D5 | 6B8 | 92C | 841 | BEF | A82 | D3A | C57 | FF9 | E94 |
| 3 | 37 | 1ED | 243 | 32E | 496 | 5FB | 655 | 738 | 8AC | 9C1 | A6F | B02 | CBA | DD7 | E79 | F14 |
| 3 | 38 | 12D | 283 | 3EE | 456 | 53B | 695 | 7F8 | 86C | 901 | AAF | BC2 | C7A | D17 | EB9 | FD4 |
| 3 | 39 | 14D | 2E3 | 38E | 436 | 55B | 6F5 | 798 | 80C | 961 | ACF | BA2 | C1A | D77 | ED9 | FB4 |
| 3 | 40 | 17D | 2D3 | 3BE | 406 | 56B | 6C5 | 7A8 | 83C | 951 | AFF | B92 | C2A | D47 | EE9 | F84 |
| 3 | 41 | 165 | 2CB | 3A6 | 41E | 573 | 6DD | 7B0 | 824 | 949 | AE7 | B8A | C32 | D5F | EF1 | F9C |
| 3 | 42 | 169 | 2C7 | 3AA | 412 | 57F | 6D1 | 7BC | 828 | 945 | AEB | B86 | C3E | D53 | EFD | F90 |
| 3 | 43 | 16F | 2C1 | 3AC | 414 | 579 | 6D7 | 7BA | 82E | 943 | AED | B80 | C38 | D55 | EFB | F96 |
| 3 | 44 | 16C | 2C2 | 3AF | 417 | 57A | 6D4 | 7B9 | 82D | 940 | AEE | B83 | C3B | D56 | EF8 | F95 |

FIG. 3

|   |    | Bits in Error within the package in HexaDecimal notation: |     |     |     |     |     |     |     |     |     |     |     |     |     |
|---|----|-----|-----|-----|-----|-----|-----|-----|-----|-----|-----|-----|-----|-----|-----|
|   |    | 1   | 2   | 3   | 4   | 5   | 6   | 7   | 8   | 9   | A   | B   | C   | D   | E   | F   |
| 4 | 1  | 9BD | AE2 | BD7 | C45 | D70 | E2F | F1A | 09B | 1AE | 2F1 | 3C4 | 456 | 563 | 63C | 709 |
| 4 | 2  | 571 | 62E | 71B | 089 | 1BC | 2E3 | 3D6 | C57 | D62 | E3D | F08 | 89A | 9AF | AF0 | BC5 |
| 4 | 3  | 317 | 048 | 17D | 6EF | 7DA | 485 | 5B0 | A31 | B04 | 85B | 96E | EFC | FC9 | C96 | DA3 |
| 4 | 4  | 024 | 37B | 24E | 5DC | 4E9 | 7B6 | 683 | 902 | 837 | B68 | A5D | DCF | CFA | FA5 | E90 |
| 4 | 5  | 977 | A28 | B1D | C8F | DBA | EE5 | FD0 | 051 | 164 | 23B | 30E | 49C | 5A9 | 6F6 | 7C3 |
| 4 | 6  | 514 | 64B | 77E | 0EC | 1D9 | 286 | 3B3 | C32 | D07 | E58 | F6D | 8FF | 9CA | A95 | BA0 |
| 4 | 7  | 329 | 076 | 143 | 6D1 | 7E4 | 4BB | 58E | A0F | B3A | 865 | 950 | EC2 | FF7 | CA8 | D9D |
| 4 | 8  | 0F3 | 3AC | 299 | 50B | 43E | 761 | 654 | 9D5 | 8E0 | BBF | A8A | D18 | C2D | F72 | E47 |
| 4 | 9  | 919 | A46 | B73 | CE1 | DD4 | E8B | FBE | 03F | 10A | 255 | 360 | 4F2 | 5C7 | 698 | 7AD |
| 4 | 10 | 523 | 67C | 749 | 0DB | 1EE | 2B1 | 384 | C05 | D30 | E6F | F5A | 8C8 | 9FD | AA2 | B97 |
| 4 | 11 | 3F6 | 0A9 | 19C | 60E | 73B | 464 | 551 | AD0 | BE5 | 8BA | 98F | E1D | F28 | C77 | D42 |
| 4 | 12 | 058 | 307 | 232 | 5A0 | 495 | 7CA | 6FF | 97E | 84B | B14 | A21 | DB3 | C86 | FD9 | EEC |
| 4 | 17 | 9FF | AA0 | B95 | C07 | D32 | E6D | F58 | 0D9 | 1EC | 2B3 | 386 | 414 | 521 | 67E | 74B |
| 4 | 18 | 550 | 60F | 73A | 0A8 | 19D | 2C2 | 3F7 | C76 | D43 | E1C | F29 | 8BB | 98E | AD1 | BE4 |
| 4 | 19 | 30B | 054 | 161 | 6F3 | 7C6 | 499 | 5AC | A2D | B18 | 847 | 972 | EE0 | FD5 | C8A | DBF |
| 4 | 20 | 0E2 | 3BD | 288 | 51A | 42F | 770 | 645 | 9C4 | 8F1 | BAE | A9B | D09 | C3C | F63 | E56 |
| 4 | 21 | 95B | A04 | B31 | CA3 | D96 | EC9 | FFC | 07D | 148 | 217 | 322 | 4B0 | 585 | 6DA | 7EF |
| 4 | 22 | 502 | 65D | 768 | 0FA | 1CF | 290 | 3A5 | C24 | D11 | E4E | F7B | 8E9 | 9DC | A83 | BB6 |
| 4 | 23 | 3EA | 0B5 | 180 | 612 | 727 | 478 | 54D | ACC | BF9 | 8A6 | 993 | E01 | F34 | C6B | D5E |
| 4 | 24 | 09E | 3C1 | 2F4 | 566 | 453 | 70C | 639 | 9B8 | 88D | BD2 | AE7 | D75 | C40 | F1F | E2A |
| 4 | 25 | 90A | A55 | B60 | CF2 | DC7 | E98 | FAD | 02C | 119 | 246 | 373 | 4E1 | 5D4 | 68B | 7BE |
| 4 | 26 | 5EE | 6B1 | 784 | 016 | 123 | 27C | 349 | CC8 | DFD | EA2 | F97 | 805 | 930 | A6F | B5A |
| 4 | 27 | 39C | 0C3 | 1F6 | 664 | 751 | 40E | 53B | ABA | B8F | 8D0 | 9E5 | E77 | F42 | C1D | D28 |
| 4 | 28 | 06D | 332 | 207 | 595 | 4A0 | 7FF | 6CA | 94B | 87E | B21 | A14 | D86 | CB3 | FEC | ED9 |
| 4 | 29 | 9EC | AB3 | B86 | C14 | D21 | E7E | F4B | 0CA | 1FF | 2A0 | 395 | 407 | 532 | 66D | 758 |
| 4 | 30 | 59D | 6C2 | 7F7 | 065 | 150 | 20F | 33A | CBB | D8E | ED1 | FE4 | 876 | 943 | A1C | B29 |
| 4 | 31 | 361 | 03E | 10B | 699 | 7AC | 4F3 | 5C6 | A47 | B72 | 82D | 918 | E8A | FBF | CE0 | DD5 |
| 4 | 32 | 0D7 | 388 | 2BD | 52F | 41A | 745 | 670 | 9F1 | 8C4 | B9B | AAE | D3C | C09 | F56 | E63 |
| 4 | 33 | 935 | A6A | B5F | CCD | DF8 | EA7 | F92 | 013 | 126 | 279 | 34C | 4DE | 5EB | 6B4 | 781 |
| 4 | 34 | 535 | 66A | 75F | 0CD | 1F8 | 2A7 | 392 | C13 | D26 | E79 | F4C | 8DE | 9EB | AB4 | B81 |
| 4 | 35 | 335 | 06A | 15F | 6CD | 7F8 | 4A7 | 592 | A13 | B26 | 879 | 94C | EDE | FEB | CB4 | D81 |
| 4 | 36 | 035 | 36A | 25F | 5CD | 4F8 | 7A7 | 692 | 913 | 826 | B79 | A4C | DDE | CEB | FB4 | E81 |
| 4 | 37 | 1B5 | 2EA | 3DF | 44D | 578 | 627 | 712 | 893 | 9A6 | AF9 | BCC | C5E | D6B | E34 | F01 |
| 4 | 38 | 175 | 22A | 31F | 48D | 5B8 | 6E7 | 7D2 | 853 | 966 | A39 | B0C | C9E | DAB | EF4 | FC1 |
| 4 | 39 | 115 | 24A | 37F | 4ED | 5D8 | 687 | 7B2 | 833 | 906 | A59 | B6C | CFE | DCB | E94 | FA1 |
| 4 | 40 | 125 | 27A | 34F | 4DD | 5E8 | 6B7 | 782 | 803 | 936 | A69 | B5C | CCE | DFB | EA4 | F91 |
| 4 | 41 | 13D | 262 | 357 | 4C5 | 5F0 | 6AF | 79A | 81B | 92E | A71 | B44 | CD6 | DE3 | EBC | F89 |
| 4 | 42 | 131 | 26E | 35B | 4C9 | 5FC | 6A3 | 796 | 817 | 922 | A7D | B48 | CDA | DEF | EB0 | F85 |
| 4 | 43 | 137 | 268 | 35D | 4CF | 5FA | 6A5 | 790 | 811 | 924 | A7B | B4E | CDC | DE9 | EB6 | F83 |
| 4 | 44 | 134 | 26B | 35E | 4CC | 5F9 | 6A6 | 793 | 812 | 927 | A78 | B4D | CDF | DEA | EB5 | F80 |

FIG. 4

|   | Bits in Error within the package in HexaDecimal notation: | | | | | | | | | | | | | | |
|---|---|---|---|---|---|---|---|---|---|---|---|---|---|---|---|
|   | 1 | 2 | 3 | 4 | 5 | 6 | 7 | 8 | 9 | A | B | C | D | E | F |
| 5 1  | 95F | AB6 | B61 | CED | D3A | ED3 | F04 | 042 | 195 | 27C | 3AB | 427 | 5F0 | 619 | 7CE |
| 5 2  | 593 | 67A | 7AD | 021 | 1F6 | 21F | 3C8 | C8E | D59 | EB0 | F67 | 8EB | 93C | AD5 | B02 |
| 5 3  | 3F5 | 01C | 1CB | 647 | 790 | 479 | 5AE | AE8 | B3F | 8D6 | 901 | E8D | F5A | CB3 | D64 |
| 5 4  | 0C6 | 32F | 2F8 | 574 | 4A3 | 74A | 69D | 9DB | 80C | BE5 | A32 | DBE | C69 | F80 | E57 |
| 5 5  | 995 | A7C | BAB | C27 | DF0 | E19 | FCE | 088 | 15F | 2B6 | 361 | 4ED | 53A | 6D3 | 704 |
| 5 6  | 5F6 | 61F | 7C8 | 044 | 193 | 27A | 3AD | CEB | D3C | ED5 | F02 | 88E | 959 | AB0 | B67 |
| 5 7  | 3CB | 022 | 1F5 | 679 | 7AE | 447 | 590 | AD6 | B01 | 8E8 | 93F | EB3 | F64 | C8D | D5A |
| 5 8  | 011 | 3F8 | 22F | 5A3 | 474 | 79D | 64A | 90C | 8DB | B32 | AE5 | D69 | CBE | F57 | E80 |
| 5 9  | 9FB | A12 | BC5 | C49 | D9E | E77 | FA0 | 0E6 | 131 | 2D8 | 30F | 483 | 554 | 6BD | 76A |
| 5 10 | 5C1 | 628 | 7FF | 073 | 1A4 | 24D | 39A | CDC | D0B | EE2 | F35 | 8B9 | 96E | A87 | B50 |
| 5 11 | 314 | 0FD | 12A | 6A6 | 771 | 498 | 54F | A09 | BDE | 837 | 9E0 | E6C | FBB | C52 | D85 |
| 5 12 | 0BA | 353 | 284 | 508 | 4DF | 736 | 6E1 | 9A7 | 870 | B99 | A4E | DC2 | C15 | FFC | E2B |
| 5 13 | 9C4 | A2D | BFA | C76 | DA1 | E48 | F9F | 0D9 | 10E | 2E7 | 330 | 4BC | 56B | 682 | 755 |
| 5 14 | 51A | 6F3 | 724 | 0A8 | 17F | 296 | 341 | C07 | DD0 | E39 | FEE | 862 | 9B5 | A5C | B8B |
| 5 15 | 3BD | 054 | 183 | 60F | 7D8 | 431 | 5E6 | AA0 | B77 | 89E | 949 | EC5 | F12 | CFB | D2C |
| 5 16 | 0E2 | 30B | 2DC | 550 | 487 | 76E | 6B9 | 9FF | 828 | BC1 | A16 | D9A | C4D | FA4 | E73 |
| 5 21 | 9B9 | A50 | B87 | C0B | DDC | E35 | FE2 | 0A4 | 173 | 29A | 34D | 4C1 | 516 | 6FF | 728 |
| 5 22 | 5E0 | 609 | 7DE | 052 | 185 | 26C | 3BB | CFD | D2A | EC3 | F14 | 898 | 94F | AA6 | B71 |
| 5 23 | 308 | 0E1 | 136 | 6BA | 76D | 484 | 553 | A15 | BC2 | 82B | 9FC | E70 | FA7 | C4E | D99 |
| 5 24 | 07C | 395 | 242 | 5CE | 419 | 7F0 | 627 | 961 | 8B6 | B5F | A88 | D04 | CD3 | F3A | EED |
| 5 25 | 9E8 | A01 | BD6 | C5A | D8D | E64 | FB3 | 0F5 | 122 | 2CB | 31C | 490 | 547 | 6AE | 779 |
| 5 26 | 50C | 6E5 | 732 | 0BE | 169 | 280 | 357 | C11 | DC6 | E2F | FF8 | 874 | 9A3 | A4A | B9D |
| 5 27 | 37E | 097 | 140 | 6CC | 71B | 4F2 | 525 | A63 | BB4 | 85D | 98A | E06 | FD1 | C38 | DEF |
| 5 28 | 08F | 366 | 2B1 | 53D | 4EA | 703 | 6D4 | 992 | 845 | BAC | A7B | DF7 | C20 | FC9 | E1E |
| 5 29 | 90E | AE7 | B30 | CBC | D6B | E82 | F55 | 013 | 1C4 | 22D | 3FA | 476 | 5A1 | 648 | 79F |
| 5 30 | 57F | 696 | 741 | 0CD | 11A | 2F3 | 324 | C62 | DB5 | E5C | F8B | 807 | 9D0 | A39 | BEE |
| 5 31 | 383 | 06A | 1BD | 631 | 7E6 | 40F | 5D8 | A9E | B49 | 8A0 | 977 | EFB | F2C | CC5 | D12 |
| 5 32 | 035 | 3DC | 20B | 587 | 450 | 7B9 | 66E | 928 | 8FF | B16 | AC1 | D4D | C9A | F73 | EA4 |
| 5 33 | 9D7 | A3E | BE9 | C6A | D92 | E5B | F8C | 0CA | 11D | 2F4 | 323 | 4AF | 578 | 691 | 746 |
| 5 34 | 5D7 | 63E | 7E9 | 065 | 1B2 | 25B | 38C | CCA | D1D | EF4 | F23 | 8AF | 978 | A91 | B46 |
| 5 35 | 3D7 | 03E | 1E9 | 665 | 7B2 | 45B | 58C | ACA | B1D | 8F4 | 923 | EAF | F78 | C91 | D46 |
| 5 36 | 0D7 | 33E | 2E9 | 565 | 4B2 | 75B | 68C | 9CA | 81D | BF4 | A23 | DAF | C78 | F91 | E46 |
| 5 37 | 157 | 2BE | 369 | 4E5 | 532 | 6DB | 70C | 84A | 99D | A74 | BA3 | C2F | DF8 | E11 | FC6 |
| 5 38 | 197 | 27E | 3A9 | 425 | 5F2 | 61B | 7CC | 88A | 95D | AB4 | B63 | CEF | D38 | ED1 | F06 |
| 5 39 | 1F7 | 21E | 3C9 | 445 | 592 | 67B | 7AC | 8EA | 93D | AD4 | B03 | C8F | D58 | EB1 | F66 |
| 5 40 | 1C7 | 22E | 3F9 | 475 | 5A2 | 64B | 79C | 8DA | 90D | AE4 | B33 | CBF | D68 | E81 | F56 |
| 5 41 | 1DF | 236 | 3E1 | 46D | 5BA | 653 | 784 | 8C2 | 915 | AFC | B2B | CA7 | D70 | E99 | F4E |
| 5 42 | 1D3 | 23A | 3ED | 461 | 5B6 | 65F | 788 | 8CE | 919 | AF0 | B27 | CAB | D7C | E95 | F42 |
| 5 43 | 1D5 | 23C | 3EB | 467 | 5B0 | 659 | 78E | 8C8 | 91F | AF6 | B21 | CAD | D7A | E93 | F44 |
| 5 44 | 1D6 | 23F | 3E8 | 464 | 5B3 | 65A | 78D | 8CB | 91C | AF5 | B22 | CAE | D79 | E90 | F47 |

FIG. 5

|   |   | \multicolumn{15}{c}{Bits in Error within the package in HexaDecimal notation:} |
|---|---|---|---|---|---|---|---|---|---|---|---|---|---|---|---|
|   |   | 1 | 2 | 3 | 4 | 5 | 6 | 7 | 8 | 9 | A | B | C | D | E | F |
| 6 | 1 | 923 | A57 | BFC | CBF | D14 | E60 | FCB | 0E6 | 14D | 239 | 392 | 4D1 | 57A | 60E | 7A5 |
| 6 | 2 | 5EF | 69B | 730 | 073 | 1D8 | 2AC | 307 | C2A | D81 | EF5 | F5E | 81D | 9B6 | AC2 | B69 |
| 6 | 3 | 389 | 0FD | 156 | 615 | 7BE | 4CA | 561 | A4C | BE7 | 893 | 938 | E7B | FD0 | CA4 | D0F |
| 6 | 4 | 0BA | 3CE | 265 | 526 | 48D | 7F9 | 652 | 97F | 8D4 | BA0 | A0B | D48 | CE3 | F97 | E3C |
| 6 | 5 | 9E9 | A9D | B36 | C75 | DDE | EAA | F01 | 02C | 187 | 2F3 | 358 | 41B | 5B0 | 6C4 | 76F |
| 6 | 6 | 58A | 6FE | 755 | 016 | 1BD | 2C9 | 362 | C4F | DE4 | E90 | F3B | 878 | 9D3 | AA7 | B0C |
| 6 | 7 | 3B7 | 0C3 | 168 | 62B | 780 | 4F4 | 55F | A72 | BD9 | 8AD | 906 | E45 | FEE | C9A | D31 |
| 6 | 8 | 06D | 319 | 2B2 | 5F1 | 45A | 72E | 685 | 9A8 | 803 | B77 | ADC | D9F | C34 | F40 | EEB |
| 6 | 9 | 987 | AF3 | B58 | C1B | DB0 | EC4 | F6F | 042 | 1E9 | 29D | 336 | 475 | 5DE | 6AA | 701 |
| 6 | 10 | 5BD | 6C9 | 762 | 021 | 18A | 2FE | 355 | C78 | DD3 | EA7 | F0C | 84F | 9E4 | A90 | B3B |
| 6 | 11 | 368 | 01C | 1B7 | 6F4 | 75F | 42B | 580 | AAD | B06 | 872 | 9D9 | E9A | F31 | C45 | DEE |
| 6 | 12 | 0C6 | 3B2 | 219 | 55A | 4F1 | 785 | 62E | 903 | 8A8 | BDC | A77 | D34 | C9F | FEB | E40 |
| 6 | 13 | 9B8 | ACC | B67 | C24 | D8F | EFB | F50 | 07D | 1D6 | 2A2 | 309 | 44A | 5E1 | 695 | 73E |
| 6 | 14 | 566 | 612 | 7B9 | 0FA | 151 | 225 | 38E | CA3 | D08 | E7C | FD7 | 894 | 93F | A4B | BE0 |
| 6 | 15 | 3C1 | 0B5 | 11E | 65D | 7F6 | 482 | 529 | A04 | BAF | 8DB | 970 | E33 | F98 | CEC | D47 |
| 6 | 16 | 09E | 3EA | 241 | 502 | 4A9 | 7DD | 676 | 95B | 8F0 | B84 | A2F | D6C | CC7 | FB3 | E18 |
| 6 | 17 | 961 | A15 | BBE | CFD | D56 | E22 | F89 | 0A4 | 10F | 27B | 3D0 | 493 | 538 | 64C | 7E7 |
| 6 | 18 | 5CE | 6BA | 711 | 052 | 1F9 | 28D | 326 | C0B | DA0 | ED4 | F7F | 83C | 997 | AE3 | B48 |
| 6 | 19 | 395 | 0E1 | 14A | 609 | 7A2 | 4D6 | 57D | A50 | BFB | 88F | 924 | E67 | FCC | CB8 | D13 |
| 6 | 20 | 07C | 308 | 2A3 | 5E0 | 44B | 73F | 694 | 9B9 | 812 | B66 | ACD | D8E | C25 | F51 | EFA |
| 6 | 25 | 994 | AE0 | B4B | C08 | DA3 | ED7 | F7C | 051 | 1FA | 28E | 325 | 466 | 5CD | 6B9 | 712 |
| 6 | 26 | 570 | 604 | 7AF | 0EC | 147 | 233 | 398 | CB5 | D1E | E6A | FC1 | 882 | 929 | A5D | BF6 |
| 6 | 27 | 302 | 076 | 1DD | 69E | 735 | 441 | 5EA | AC7 | B6C | 818 | 9B3 | EF0 | F5B | C2F | D84 |
| 6 | 28 | 0F3 | 387 | 22C | 56F | 4C4 | 7B0 | 61B | 936 | 89D | BE9 | A42 | D01 | CAA | FDE | E75 |
| 6 | 29 | 972 | A06 | BAD | CEE | D45 | E31 | F9A | 0B7 | 11C | 268 | 3C3 | 480 | 52B | 65F | 7F4 |
| 6 | 30 | 503 | 677 | 7DC | 09F | 134 | 240 | 3EB | CC6 | D6D | E19 | FB2 | 8F1 | 95A | A2E | B85 |
| 6 | 31 | 3FF | 08B | 120 | 663 | 7C8 | 4BC | 517 | A3A | B91 | 8E5 | 94E | E0D | FA6 | CD2 | D79 |
| 6 | 32 | 049 | 33D | 296 | 5D5 | 47E | 70A | 6A1 | 98C | 827 | B53 | AF8 | DBB | C10 | F64 | ECF |
| 6 | 33 | 9AB | ADF | B74 | C37 | D9C | EE8 | F43 | 06E | 1C5 | 2B1 | 31A | 459 | 5F2 | 686 | 72D |
| 6 | 34 | 5AB | 6DF | 774 | 037 | 19C | 2E8 | 343 | C6E | DC5 | EB1 | F1A | 859 | 9F2 | A86 | B2D |
| 6 | 35 | 3AB | 0DF | 174 | 637 | 79C | 4E8 | 543 | A6E | BC5 | 8B1 | 91A | E59 | FF2 | C86 | D2D |
| 6 | 36 | 0AB | 3DF | 274 | 537 | 49C | 7E8 | 643 | 96E | 8C5 | BB1 | A1A | D59 | CF2 | F86 | E2D |
| 6 | 37 | 12B | 25F | 3F4 | 4B7 | 51C | 668 | 7C3 | 8EE | 945 | A31 | B9A | CD9 | D72 | E06 | FAD |
| 6 | 38 | 1EB | 29F | 334 | 477 | 5DC | 6A8 | 703 | 82E | 985 | AF1 | B5A | C19 | DB2 | EC6 | F6D |
| 6 | 39 | 18B | 2FF | 354 | 417 | 5BC | 6C8 | 763 | 84E | 9E5 | A91 | B3A | C79 | DD2 | EA6 | F0D |
| 6 | 40 | 1BB | 2CF | 364 | 427 | 58C | 6F8 | 753 | 87E | 9D5 | AA1 | B0A | C49 | DE2 | E96 | F3D |
| 6 | 41 | 1A3 | 2D7 | 37C | 43F | 594 | 6E0 | 74B | 866 | 9CD | AB9 | B12 | C51 | DFA | E8E | F25 |
| 6 | 42 | 1AF | 2DB | 370 | 433 | 598 | 6EC | 747 | 86A | 9C1 | AB5 | B1E | C5D | DF6 | E82 | F29 |
| 6 | 43 | 1A9 | 2DD | 376 | 435 | 59E | 6EA | 741 | 86C | 9C7 | AB3 | B18 | C5B | DF0 | E84 | F2F |
| 6 | 44 | 1AA | 2DE | 375 | 436 | 59D | 6E9 | 742 | 86F | 9C4 | AB0 | B1B | C58 | DF3 | E87 | F2C |

FIG. 6

|   |   | Bits in Error within the package in HexaDecimal notation: |   |   |   |   |   |   |   |   |   |   |   |   |   |
|---|---|---|---|---|---|---|---|---|---|---|---|---|---|---|---|---|
|   |   | 1 | 2 | 3 | 4 | 5 | 6 | 7 | 8 | 9 | A | B | C | D | E | F |
| 7 | 1 | 9D0 | A21 | B79 | C53 | D0B | EFA | FA2 | 0B7 | 1EF | 21E | 346 | 46C | 534 | 6C5 | 79D |
| 7 | 2 | 51C | 6ED | 7B5 | 09F | 1C7 | 236 | 36E | C7B | D23 | ED2 | F8A | 8A0 | 9F8 | A09 | B51 |
| 7 | 3 | 37A | 08B | 1D3 | 6F9 | 7A1 | 450 | 508 | A1D | B45 | 8B4 | 9EC | EC6 | F9E | C6F | D37 |
| 7 | 4 | 049 | 3B8 | 2E0 | 5CA | 492 | 763 | 63B | 92E | 876 | B87 | ADF | DF5 | CAD | F5C | E04 |
| 7 | 5 | 91A | AEB | BB3 | C99 | DC1 | E30 | F68 | 07D | 125 | 2D4 | 38C | 4A6 | 5FE | 60F | 757 |
| 7 | 6 | 579 | 688 | 7D0 | 0FA | 1A2 | 253 | 30B | C1E | D46 | EB7 | FEF | 8C5 | 99D | A6C | B34 |
| 7 | 7 | 344 | 0B5 | 1ED | 6C7 | 79F | 46E | 536 | A23 | B7B | 88A | 9D2 | EF8 | FA0 | C51 | D09 |
| 7 | 8 | 09E | 36F | 237 | 51D | 445 | 7B4 | 6EC | 9F9 | 8A1 | B50 | A08 | D22 | C7A | F8B | ED3 |
| 7 | 9 | 974 | A85 | BDD | CF7 | DAF | E5E | F06 | 013 | 14B | 2BA | 3E2 | 4C8 | 590 | 661 | 739 |
| 7 | 10 | 54E | 6BF | 7E7 | 0CD | 195 | 264 | 33C | C29 | D71 | E80 | FD8 | 8F2 | 9AA | A5B | B03 |
| 7 | 11 | 39B | 06A | 132 | 618 | 740 | 4B1 | 5E9 | AFC | BA4 | 855 | 90D | E27 | F7F | C8E | DD6 |
| 7 | 12 | 035 | 3C4 | 29C | 5B6 | 4EE | 71F | 647 | 952 | 80A | BFB | AA3 | D89 | CD1 | F20 | E78 |
| 7 | 13 | 94B | ABA | BE2 | CC8 | D90 | E61 | F39 | 02C | 174 | 285 | 3DD | 4F7 | 5AF | 65E | 706 |
| 7 | 14 | 595 | 664 | 73C | 016 | 14E | 2BF | 3E7 | CF2 | DAA | E5B | F03 | 829 | 971 | A80 | BD8 |
| 7 | 15 | 332 | 0C3 | 19B | 6B1 | 7E9 | 418 | 540 | A55 | B0D | 8FC | 9A4 | E8E | FD6 | C27 | D7F |
| 7 | 16 | 06D | 39C | 2C4 | 5EE | 4B6 | 747 | 61F | 90A | 852 | BA3 | AFB | DD1 | C89 | F78 | E20 |
| 7 | 17 | 992 | A63 | B3B | C11 | D49 | EB8 | FE0 | 0F5 | 1AD | 25C | 304 | 42E | 576 | 687 | 7DF |
| 7 | 18 | 53D | 6CC | 794 | 0BE | 1E6 | 217 | 34F | C5A | D02 | EF3 | FAB | 881 | 9D9 | A28 | B70 |
| 7 | 19 | 366 | 097 | 1CF | 6E5 | 7BD | 44C | 514 | A01 | B59 | 8A8 | 9F0 | EDA | F82 | C73 | D2B |
| 7 | 20 | 08F | 37E | 226 | 50C | 454 | 7A5 | 6FD | 9E8 | 8B0 | B41 | A19 | D33 | C6B | F9A | EC2 |
| 7 | 21 | 936 | AC7 | B9F | CB5 | DED | E1C | F44 | 051 | 109 | 2F8 | 3A0 | 48A | 5D2 | 623 | 77B |
| 7 | 22 | 56F | 69E | 7C6 | 0EC | 1B4 | 245 | 31D | C08 | D50 | EA1 | FF9 | 8D3 | 98B | A7A | B22 |
| 7 | 23 | 387 | 076 | 12E | 604 | 75C | 4AD | 5F5 | AE0 | BB8 | 849 | 911 | E3B | F63 | C92 | DCA |
| 7 | 24 | 0F3 | 302 | 25A | 570 | 428 | 7D9 | 681 | 994 | 8CC | B3D | A65 | D4F | C17 | FE6 | EBE |
| 7 | 29 | 981 | A70 | B28 | C02 | D5A | EAB | FF3 | 0E6 | 1BE | 24F | 317 | 43D | 565 | 694 | 7CC |
| 7 | 30 | 5F0 | 601 | 759 | 073 | 12B | 2DA | 382 | C97 | DCF | E3E | F66 | 84C | 914 | AE5 | BBD |
| 7 | 31 | 30C | 0FD | 1A5 | 68F | 7D7 | 426 | 57E | A6B | B33 | 8C2 | 99A | EB0 | FE8 | C19 | D41 |
| 7 | 32 | 0BA | 34B | 213 | 539 | 461 | 790 | 6C8 | 9DD | 885 | B74 | A2C | D06 | C5E | FAF | EF7 |
| 7 | 33 | 958 | AA9 | BF1 | CDB | D83 | E72 | F2A | 03F | 167 | 296 | 3CE | 4E4 | 5BC | 64D | 715 |
| 7 | 34 | 558 | 6A9 | 7F1 | 0DB | 183 | 272 | 32A | C3F | D67 | E96 | FCE | 8E4 | 9BC | A4D | B15 |
| 7 | 35 | 358 | 0A9 | 1F1 | 6DB | 783 | 472 | 52A | A3F | B67 | 896 | 9CE | EE4 | FBC | C4D | D15 |
| 7 | 36 | 058 | 3A9 | 2F1 | 5DB | 483 | 772 | 62A | 93F | 867 | B96 | ACE | DE4 | CBC | F4D | E15 |
| 7 | 37 | 1D8 | 229 | 371 | 45B | 503 | 6F2 | 7AA | 8BF | 9E7 | A16 | B4E | C64 | D3C | ECD | F95 |
| 7 | 38 | 118 | 2E9 | 3B1 | 49B | 5C3 | 632 | 76A | 87F | 927 | AD6 | B8E | CA4 | DFC | E0D | F55 |
| 7 | 39 | 178 | 289 | 3D1 | 4FB | 5A3 | 652 | 70A | 81F | 947 | AB6 | BEE | CC4 | D9C | E6D | F35 |
| 7 | 40 | 148 | 2B9 | 3E1 | 4CB | 593 | 662 | 73A | 82F | 977 | A86 | BDE | CF4 | DAC | E5D | F05 |
| 7 | 41 | 150 | 2A1 | 3F9 | 4D3 | 58B | 67A | 722 | 837 | 96F | A9E | BC6 | CEC | DB4 | E45 | F1D |
| 7 | 42 | 15C | 2AD | 3F5 | 4DF | 587 | 676 | 72E | 83B | 963 | A92 | BCA | CE0 | DB8 | E49 | F11 |
| 7 | 43 | 15A | 2AB | 3F3 | 4D9 | 581 | 670 | 728 | 83D | 965 | A94 | BCC | CE6 | DBE | E4F | F17 |
| 7 | 44 | 159 | 2A8 | 3F0 | 4DA | 582 | 673 | 72B | 83E | 966 | A97 | BCF | CE5 | DBD | E4C | F14 |

FIG. 7

| | Bits in Error within the package in HexaDecimal notation: | | | | | | | | | | | | | | |
|---|---|---|---|---|---|---|---|---|---|---|---|---|---|---|---|
| | 1 | 2 | 3 | 4 | 5 | 6 | 7 | 8 | 9 | A | B | C | D | E | F |
| 8 1 | 96A | ADC | B3E | C20 | DC2 | E74 | F96 | 051 | 1B3 | 205 | 3E7 | 4F9 | 51B | 6AD | 74F |
| 8 2 | 5A6 | 610 | 7F2 | 0EC | 10E | 2B8 | 35A | C9D | D7F | EC9 | F2B | 835 | 9D7 | A61 | B83 |
| 8 3 | 3C0 | 076 | 194 | 68A | 768 | 4DE | 53C | AFB | B19 | 8AF | 94D | E53 | FB1 | C07 | DE5 |
| 8 4 | 0F3 | 345 | 2A7 | 5B9 | 45B | 7ED | 60F | 9C8 | 82A | B9C | A7E | D60 | C82 | F34 | ED6 |
| 8 5 | 9A0 | A16 | BF4 | CEA | D08 | EBE | F5C | 09B | 179 | 2CF | 32D | 433 | 5D1 | 667 | 785 |
| 8 6 | 5C3 | 675 | 797 | 089 | 16B | 2DD | 33F | CF8 | D1A | EAC | F4E | 850 | 9B2 | A04 | BE6 |
| 8 7 | 3FE | 048 | 1AA | 6B4 | 756 | 4E0 | 502 | AC5 | B27 | 891 | 973 | E6D | F8F | C39 | DDB |
| 8 8 | 024 | 392 | 270 | 56E | 48C | 73A | 6D8 | 91F | 8FD | B4B | AA9 | DB7 | C55 | FE3 | E01 |
| 8 9 | 9CE | A78 | B9A | C84 | D66 | ED0 | F32 | 0F5 | 117 | 2A1 | 343 | 45D | 5BF | 609 | 7EB |
| 8 10 | 5F4 | 642 | 7A0 | 0BE | 15C | 2EA | 308 | CCF | D2D | E9B | F79 | 867 | 985 | A33 | BD1 |
| 8 11 | 321 | 097 | 175 | 66B | 789 | 43F | 5DD | A1A | BF8 | 84E | 9AC | EB2 | F50 | CE6 | D04 |
| 8 12 | 08F | 339 | 2DB | 5C5 | 427 | 791 | 673 | 9B4 | 856 | BE0 | A02 | D1C | CFE | F48 | EAA |
| 8 13 | 9F1 | A47 | BA5 | CBB | D59 | EEF | F0D | 0CA | 128 | 29E | 37C | 462 | 580 | 636 | 7D4 |
| 8 14 | 52F | 699 | 77B | 065 | 187 | 231 | 3D3 | C14 | DF6 | E40 | FA2 | 8BC | 95E | AE8 | B0A |
| 8 15 | 388 | 03E | 1DC | 6C2 | 720 | 496 | 574 | AB3 | B51 | 8E7 | 905 | E1B | FF9 | C4F | DAD |
| 8 16 | 0D7 | 361 | 283 | 59D | 47F | 7C9 | 62B | 9EC | 80E | BB8 | A5A | D44 | CA6 | F10 | EF2 |
| 8 17 | 928 | A9E | B7C | C62 | D80 | E36 | FD4 | 013 | 1F1 | 247 | 3A5 | 4BB | 559 | 6EF | 70D |
| 8 18 | 587 | 631 | 7D3 | 0CD | 12F | 299 | 37B | CBC | D5E | EE8 | F0A | 814 | 9F6 | A40 | BA2 |
| 8 19 | 3DC | 06A | 188 | 696 | 774 | 4C2 | 520 | AE7 | B05 | 8B3 | 951 | E4F | FAD | C1B | DF9 |
| 8 20 | 035 | 383 | 261 | 57F | 49D | 72B | 6C9 | 90E | 8EC | B5A | AB8 | DA6 | C44 | FF2 | E10 |
| 8 21 | 98C | A3A | BD8 | CC6 | D24 | E92 | F70 | 0B7 | 155 | 2E3 | 301 | 41F | 5FD | 64B | 7A9 |
| 8 22 | 5D5 | 663 | 781 | 09F | 17D | 2CB | 329 | CEE | D0C | EBA | F58 | 846 | 9A4 | A12 | BF0 |
| 8 23 | 33D | 08B | 169 | 677 | 795 | 423 | 5C1 | A06 | BE4 | 852 | 9B0 | EAE | F4C | CFA | D18 |
| 8 24 | 049 | 3FF | 21D | 503 | 4E1 | 757 | 6B5 | 972 | 890 | B26 | AC4 | DDA | C38 | F8E | E6C |
| 8 25 | 9DD | A6B | B89 | C97 | D75 | EC3 | F21 | 0E6 | 104 | 2B2 | 350 | 44E | 5AC | 61A | 7F8 |
| 8 26 | 539 | 68F | 76D | 073 | 191 | 227 | 3C5 | C02 | DE0 | E56 | FB4 | 8AA | 948 | AFE | B1C |
| 8 27 | 34B | 0FD | 11F | 601 | 7E3 | 455 | 5B7 | A70 | B92 | 824 | 9C6 | ED8 | F3A | C8C | D6E |
| 8 28 | 0BA | 30C | 2EE | 5F0 | 412 | 7A4 | 646 | 981 | 863 | BD5 | A37 | D29 | CCB | F7D | E9F |
| 8 33 | 9E2 | A54 | BB6 | CA8 | D4A | EFC | F1E | 0D9 | 13B | 28D | 36F | 471 | 593 | 625 | 7C7 |
| 8 34 | 5E2 | 654 | 7B6 | 0A8 | 14A | 2FC | 31E | CD9 | D3B | E8D | F6F | 871 | 993 | A25 | BC7 |
| 8 35 | 3E2 | 054 | 1B6 | 6A8 | 74A | 4FC | 51E | AD9 | B3B | 88D | 96F | E71 | F93 | C25 | DC7 |
| 8 36 | 0E2 | 354 | 2B6 | 5A8 | 44A | 7FC | 61E | 9D9 | 83B | B8D | A6F | D71 | C93 | F25 | EC7 |
| 8 37 | 162 | 2D4 | 336 | 428 | 5CA | 67C | 79E | 859 | 9BB | A0D | BEF | CF1 | D13 | EA5 | F47 |
| 8 38 | 1A2 | 214 | 3F6 | 4E8 | 50A | 6BC | 75E | 899 | 97B | ACD | B2F | C31 | DD3 | E65 | F87 |
| 8 39 | 1C2 | 274 | 396 | 488 | 56A | 6DC | 73E | 8F9 | 91B | AAD | B4F | C51 | DB3 | E05 | FE7 |
| 8 40 | 1F2 | 244 | 3A6 | 4B8 | 55A | 6EC | 70E | 8C9 | 92B | A9D | B7F | C61 | D83 | E35 | FD7 |
| 8 41 | 1EA | 25C | 3BE | 4A0 | 542 | 6F4 | 716 | 8D1 | 933 | A85 | B67 | C79 | D9B | E2D | FCF |
| 8 42 | 1E6 | 250 | 3B2 | 4AC | 54E | 6F8 | 71A | 8DD | 93F | A89 | B6B | C75 | D97 | E21 | FC3 |
| 8 43 | 1E0 | 256 | 3B4 | 4AA | 548 | 6FE | 71C | 8DB | 939 | A8F | B6D | C73 | D91 | E27 | FC5 |
| 8 44 | 1E3 | 255 | 3B7 | 4A9 | 54B | 6FD | 71F | 8D8 | 93A | A8C | B6E | C70 | D92 | E24 | FC6 |

FIG. 8

|   |   | Bits in Error within the package in HexaDecimal notation: | | | | | | | | | | | | | |
|---|---|---|---|---|---|---|---|---|---|---|---|---|---|---|---|
|   |   | 1 | 2 | 3 | 4 | 5 | 6 | 7 | 8 | 9 | A | B | C | D | E | F |
| 9 | 1  | 988 | A88 | B88 | C88 | D88 | E88 | F88 | 088 | 188 | 288 | 388 | 488 | 588 | 688 | 788 |
| 9 | 2  | 544 | 644 | 744 | 044 | 144 | 244 | 344 | C44 | D44 | E44 | F44 | 844 | 944 | A44 | B44 |
| 9 | 3  | 322 | 022 | 122 | 622 | 722 | 422 | 522 | A22 | B22 | 822 | 922 | E22 | F22 | C22 | D22 |
| 9 | 4  | 011 | 311 | 211 | 511 | 411 | 711 | 611 | 911 | 811 | B11 | A11 | D11 | C11 | F11 | E11 |
| 9 | 5  | 942 | A42 | B42 | C42 | D42 | E42 | F42 | 042 | 142 | 242 | 342 | 442 | 542 | 642 | 742 |
| 9 | 6  | 521 | 621 | 721 | 021 | 121 | 221 | 321 | C21 | D21 | E21 | F21 | 821 | 921 | A21 | B21 |
| 9 | 7  | 31C | 01C | 11C | 61C | 71C | 41C | 51C | A1C | B1C | 81C | 91C | E1C | F1C | C1C | D1C |
| 9 | 8  | 0C6 | 3C6 | 2C6 | 5C6 | 4C6 | 7C6 | 6C6 | 9C6 | 8C6 | BC6 | AC6 | DC6 | CC6 | FC6 | EC6 |
| 9 | 9  | 92C | A2C | B2C | C2C | D2C | E2C | F2C | 02C | 12C | 22C | 32C | 42C | 52C | 62C | 72C |
| 9 | 10 | 516 | 616 | 716 | 016 | 116 | 216 | 316 | C16 | D16 | E16 | F16 | 816 | 916 | A16 | B16 |
| 9 | 11 | 3C3 | 0C3 | 1C3 | 6C3 | 7C3 | 4C3 | 5C3 | AC3 | BC3 | 8C3 | 9C3 | EC3 | FC3 | CC3 | DC3 |
| 9 | 12 | 06D | 36D | 26D | 56D | 46D | 76D | 66D | 96D | 86D | B6D | A6D | D6D | C6D | F6D | E6D |
| 9 | 13 | 913 | A13 | B13 | C13 | D13 | E13 | F13 | 013 | 113 | 213 | 313 | 413 | 513 | 613 | 713 |
| 9 | 14 | 5CD | 6CD | 7CD | 0CD | 1CD | 2CD | 3CD | CCD | DCD | ECD | FCD | 8CD | 9CD | ACD | BCD |
| 9 | 15 | 36A | 06A | 16A | 66A | 76A | 46A | 56A | A6A | B6A | 86A | 96A | E6A | F6A | C6A | D6A |
| 9 | 16 | 035 | 335 | 235 | 535 | 435 | 735 | 635 | 935 | 835 | B35 | A35 | D35 | C35 | F35 | E35 |
| 9 | 17 | 9CA | ACA | BCA | CCA | DCA | ECA | FCA | 0CA | 1CA | 2CA | 3CA | 4CA | 5CA | 6CA | 7CA |
| 9 | 18 | 565 | 665 | 765 | 065 | 165 | 265 | 365 | C65 | D65 | E65 | F65 | 865 | 965 | A65 | B65 |
| 9 | 19 | 33E | 03E | 13E | 63E | 73E | 43E | 53E | A3E | B3E | 83E | 93E | E3E | F3E | C3E | D3E |
| 9 | 20 | 0D7 | 3D7 | 2D7 | 5D7 | 4D7 | 7D7 | 6D7 | 9D7 | 8D7 | BD7 | AD7 | DD7 | CD7 | FD7 | ED7 |
| 9 | 21 | 96E | A6E | B6E | C6E | D6E | E6E | F6E | 06E | 16E | 26E | 36E | 46E | 56E | 66E | 76E |
| 9 | 22 | 537 | 637 | 737 | 037 | 137 | 237 | 337 | C37 | D37 | E37 | F37 | 837 | 937 | A37 | B37 |
| 9 | 23 | 3DF | 0DF | 1DF | 6DF | 7DF | 4DF | 5DF | ADF | BDF | 8DF | 9DF | EDF | FDF | CDF | DDF |
| 9 | 24 | 0AB | 3AB | 2AB | 5AB | 4AB | 7AB | 6AB | 9AB | 8AB | BAB | AAB | DAB | CAB | FAB | EAB |
| 9 | 25 | 93F | A3F | B3F | C3F | D3F | E3F | F3F | 03F | 13F | 23F | 33F | 43F | 53F | 63F | 73F |
| 9 | 26 | 5DB | 6DB | 7DB | 0DB | 1DB | 2DB | 3DB | CDB | DDB | EDB | FDB | 8DB | 9DB | ADB | BDB |
| 9 | 27 | 3A9 | 0A9 | 1A9 | 6A9 | 7A9 | 4A9 | 5A9 | AA9 | BA9 | 8A9 | 9A9 | EA9 | FA9 | CA9 | DA9 |
| 9 | 28 | 058 | 358 | 258 | 558 | 458 | 758 | 658 | 958 | 858 | B58 | A58 | D58 | C58 | F58 | E58 |
| 9 | 29 | 9D9 | AD9 | BD9 | CD9 | DD9 | ED9 | FD9 | 0D9 | 1D9 | 2D9 | 3D9 | 4D9 | 5D9 | 6D9 | 7D9 |
| 9 | 30 | 5A8 | 6A8 | 7A8 | 0A8 | 1A8 | 2A8 | 3A8 | CA8 | DA8 | EA8 | FA8 | 8A8 | 9A8 | AA8 | BA8 |
| 9 | 31 | 354 | 054 | 154 | 654 | 754 | 454 | 554 | A54 | B54 | 854 | 954 | E54 | F54 | C54 | D54 |
| 9 | 32 | 0E2 | 3E2 | 2E2 | 5E2 | 4E2 | 7E2 | 6E2 | 9E2 | 8E2 | BE2 | AE2 | DE2 | CE2 | FE2 | EE2 |
| 9 | 37 | 180 | 280 | 380 | 480 | 580 | 680 | 780 | 880 | 980 | A80 | B80 | C80 | D80 | E80 | F80 |
| 9 | 38 | 140 | 240 | 340 | 440 | 540 | 640 | 740 | 840 | 940 | A40 | B40 | C40 | D40 | E40 | F40 |
| 9 | 39 | 120 | 220 | 320 | 420 | 520 | 620 | 720 | 820 | 920 | A20 | B20 | C20 | D20 | E20 | F20 |
| 9 | 40 | 110 | 210 | 310 | 410 | 510 | 610 | 710 | 810 | 910 | A10 | B10 | C10 | D10 | E10 | F10 |
| 9 | 41 | 108 | 208 | 308 | 408 | 508 | 608 | 708 | 808 | 908 | A08 | B08 | C08 | D08 | E08 | F08 |
| 9 | 42 | 104 | 204 | 304 | 404 | 504 | 604 | 704 | 804 | 904 | A04 | B04 | C04 | D04 | E04 | F04 |
| 9 | 43 | 102 | 202 | 302 | 402 | 502 | 602 | 702 | 802 | 902 | A02 | B02 | C02 | D02 | E02 | F02 |
| 9 | 44 | 101 | 201 | 301 | 401 | 501 | 601 | 701 | 801 | 901 | A01 | B01 | C01 | D01 | E01 | F01 |

FIG. 9

|  | Bits in Error within the package in HexaDecimal notation: | | | | | | | | | | | | | | |
|---|---|---|---|---|---|---|---|---|---|---|---|---|---|---|---|
|  | 1 | 2 | 3 | 4 | 5 | 6 | 7 | 8 | 9 | A | B | C | D | E | F |
| 10 1 | 898 | 8A8 | 8B8 | 8C8 | 8D8 | 8E8 | 8F8 | 808 | 818 | 828 | 838 | 848 | 858 | 868 | 878 |
| 10 2 | 454 | 464 | 474 | 404 | 414 | 424 | 434 | 4C4 | 4D4 | 4E4 | 4F4 | 484 | 494 | 4A4 | 4B4 |
| 10 3 | 232 | 202 | 212 | 262 | 272 | 242 | 252 | 2A2 | 2B2 | 282 | 292 | 2E2 | 2F2 | 2C2 | 2D2 |
| 10 4 | 101 | 131 | 121 | 151 | 141 | 171 | 161 | 191 | 181 | 1B1 | 1A1 | 1D1 | 1C1 | 1F1 | 1E1 |
| 10 5 | 852 | 862 | 872 | 802 | 812 | 822 | 832 | 8C2 | 8D2 | 8E2 | 8F2 | 882 | 892 | 8A2 | 8B2 |
| 10 6 | 431 | 401 | 411 | 461 | 471 | 441 | 451 | 4A1 | 4B1 | 481 | 491 | 4E1 | 4F1 | 4C1 | 4D1 |
| 10 7 | 20C | 23C | 22C | 25C | 24C | 27C | 26C | 29C | 28C | 2BC | 2AC | 2DC | 2CC | 2FC | 2EC |
| 10 8 | 1D6 | 1E6 | 1F6 | 186 | 196 | 1A6 | 1B6 | 146 | 156 | 166 | 176 | 106 | 116 | 126 | 136 |
| 10 9 | 83C | 80C | 81C | 86C | 87C | 84C | 85C | 8AC | 8BC | 88C | 89C | 8EC | 8FC | 8CC | 8DC |
| 10 10 | 406 | 436 | 426 | 456 | 446 | 476 | 466 | 496 | 486 | 4B6 | 4A6 | 4D6 | 4C6 | 4F6 | 4E6 |
| 10 11 | 2D3 | 2E3 | 2F3 | 283 | 293 | 2A3 | 2B3 | 243 | 253 | 263 | 273 | 203 | 213 | 223 | 233 |
| 10 12 | 17D | 14D | 15D | 12D | 13D | 10D | 11D | 1ED | 1FD | 1CD | 1DD | 1AD | 1BD | 18D | 19D |
| 10 13 | 803 | 833 | 823 | 853 | 843 | 873 | 863 | 893 | 883 | 8B3 | 8A3 | 8D3 | 8C3 | 8F3 | 8E3 |
| 10 14 | 4DD | 4ED | 4FD | 48D | 49D | 4AD | 4BD | 44D | 45D | 46D | 47D | 40D | 41D | 42D | 43D |
| 10 15 | 27A | 24A | 25A | 22A | 23A | 20A | 21A | 2EA | 2FA | 2CA | 2DA | 2AA | 2BA | 28A | 29A |
| 10 16 | 125 | 115 | 105 | 175 | 165 | 155 | 145 | 1B5 | 1A5 | 195 | 185 | 1F5 | 1E5 | 1D5 | 1C5 |
| 10 17 | 8DA | 8EA | 8FA | 88A | 89A | 8AA | 8BA | 84A | 85A | 86A | 87A | 80A | 81A | 82A | 83A |
| 10 18 | 475 | 445 | 455 | 425 | 435 | 405 | 415 | 4E5 | 4F5 | 4C5 | 4D5 | 4A5 | 4B5 | 485 | 495 |
| 10 19 | 22E | 21E | 20E | 27E | 26E | 25E | 24E | 2BE | 2AE | 29E | 28E | 2FE | 2EE | 2DE | 2CE |
| 10 20 | 1C7 | 1F7 | 1E7 | 197 | 187 | 1B7 | 1A7 | 157 | 147 | 177 | 167 | 117 | 107 | 137 | 127 |
| 10 21 | 87E | 84E | 85E | 82E | 83E | 80E | 81E | 8EE | 8FE | 8CE | 8DE | 8AE | 8BE | 88E | 89E |
| 10 22 | 427 | 417 | 407 | 477 | 467 | 457 | 447 | 4B7 | 4A7 | 497 | 487 | 4F7 | 4E7 | 4D7 | 4C7 |
| 10 23 | 2CF | 2FF | 2EF | 29F | 28F | 2BF | 2AF | 25F | 24F | 27F | 26F | 21F | 20F | 23F | 22F |
| 10 24 | 1BB | 18B | 19B | 1EB | 1FB | 1CB | 1DB | 12B | 13B | 10B | 11B | 16B | 17B | 14B | 15B |
| 10 25 | 82F | 81F | 80F | 87F | 86F | 85F | 84F | 8BF | 8AF | 89F | 88F | 8FF | 8EF | 8DF | 8CF |
| 10 26 | 4CB | 4FB | 4EB | 49B | 48B | 4BB | 4AB | 45B | 44B | 47B | 46B | 41B | 40B | 43B | 42B |
| 10 27 | 2B9 | 289 | 299 | 2E9 | 2F9 | 2C9 | 2D9 | 229 | 239 | 209 | 219 | 269 | 279 | 249 | 259 |
| 10 28 | 148 | 178 | 168 | 118 | 108 | 138 | 128 | 1D8 | 1C8 | 1F8 | 1E8 | 198 | 188 | 1B8 | 1A8 |
| 10 29 | 8C9 | 8F9 | 8E9 | 899 | 889 | 8B9 | 8A9 | 859 | 849 | 879 | 869 | 819 | 809 | 839 | 829 |
| 10 30 | 4B8 | 488 | 498 | 4E8 | 4F8 | 4C8 | 4D8 | 428 | 438 | 408 | 418 | 468 | 478 | 448 | 458 |
| 10 31 | 244 | 274 | 264 | 214 | 204 | 234 | 224 | 2D4 | 2C4 | 2F4 | 2E4 | 294 | 284 | 2B4 | 2A4 |
| 10 32 | 1F2 | 1C2 | 1D2 | 1A2 | 1B2 | 182 | 192 | 162 | 172 | 142 | 152 | 122 | 132 | 102 | 112 |
| 10 33 | 810 | 820 | 830 | 840 | 850 | 860 | 870 | 880 | 890 | 8A0 | 8B0 | 8C0 | 8D0 | 8E0 | 8F0 |
| 10 34 | 410 | 420 | 430 | 440 | 450 | 460 | 470 | 480 | 490 | 4A0 | 4B0 | 4C0 | 4D0 | 4E0 | 4F0 |
| 10 35 | 210 | 220 | 230 | 240 | 250 | 260 | 270 | 280 | 290 | 2A0 | 2B0 | 2C0 | 2D0 | 2E0 | 2F0 |
| 10 36 | 110 | 120 | 130 | 140 | 150 | 160 | 170 | 180 | 190 | 1A0 | 1B0 | 1C0 | 1D0 | 1E0 | 1F0 |
| 10 41 | 018 | 028 | 038 | 048 | 058 | 068 | 078 | 088 | 098 | 0A8 | 0B8 | 0C8 | 0D8 | 0E8 | 0F8 |
| 10 42 | 014 | 024 | 034 | 044 | 054 | 064 | 074 | 084 | 094 | 0A4 | 0B4 | 0C4 | 0D4 | 0E4 | 0F4 |
| 10 43 | 012 | 022 | 032 | 042 | 052 | 062 | 072 | 082 | 092 | 0A2 | 0B2 | 0C2 | 0D2 | 0E2 | 0F2 |
| 10 44 | 011 | 021 | 031 | 041 | 051 | 061 | 071 | 081 | 091 | 0A1 | 0B1 | 0C1 | 0D1 | 0E1 | 0F1 |

FIG. 10

|   |   | Bits in Error within the package in HexaDecimal notation: | | | | | | | | | | | | | |
|---|---|---|---|---|---|---|---|---|---|---|---|---|---|---|---|
|   |   | 1 | 2 | 3 | 4 | 5 | 6 | 7 | 8 | 9 | A | B | C | D | E | F |
| 11 | 1 | 889 | 88A | 88B | 88C | 88D | 88E | 88F | 880 | 881 | 882 | 883 | 884 | 885 | 886 | 887 |
| 11 | 2 | 445 | 446 | 447 | 440 | 441 | 442 | 443 | 44C | 44D | 44E | 44F | 448 | 449 | 44A | 44B |
| 11 | 3 | 223 | 220 | 221 | 226 | 227 | 224 | 225 | 22A | 22B | 228 | 229 | 22E | 22F | 22C | 22D |
| 11 | 4 | 110 | 113 | 112 | 115 | 114 | 117 | 116 | 119 | 118 | 11B | 11A | 11D | 11C | 11F | 11E |
| 11 | 5 | 843 | 840 | 841 | 846 | 847 | 844 | 845 | 84A | 84B | 848 | 849 | 84E | 84F | 84C | 84D |
| 11 | 6 | 420 | 423 | 422 | 425 | 424 | 427 | 426 | 429 | 428 | 42B | 42A | 42D | 42C | 42F | 42E |
| 11 | 7 | 21D | 21E | 21F | 218 | 219 | 21A | 21B | 214 | 215 | 216 | 217 | 210 | 211 | 212 | 213 |
| 11 | 8 | 1C7 | 1C4 | 1C5 | 1C2 | 1C3 | 1C0 | 1C1 | 1CE | 1CF | 1CC | 1CD | 1CA | 1CB | 1C8 | 1C9 |
| 11 | 9 | 82D | 82E | 82F | 828 | 829 | 82A | 82B | 824 | 825 | 826 | 827 | 820 | 821 | 822 | 823 |
| 11 | 10 | 417 | 414 | 415 | 412 | 413 | 410 | 411 | 41E | 41F | 41C | 41D | 41A | 41B | 418 | 419 |
| 11 | 11 | 2C2 | 2C1 | 2C0 | 2C7 | 2C6 | 2C5 | 2C4 | 2CB | 2CA | 2C9 | 2C8 | 2CF | 2CE | 2CD | 2CC |
| 11 | 12 | 16C | 16F | 16E | 169 | 168 | 16B | 16A | 165 | 164 | 167 | 166 | 161 | 160 | 163 | 162 |
| 11 | 13 | 812 | 811 | 810 | 817 | 816 | 815 | 814 | 81B | 81A | 819 | 818 | 81F | 81E | 81D | 81C |
| 11 | 14 | 4CC | 4CF | 4CE | 4C9 | 4C8 | 4CB | 4CA | 4C5 | 4C4 | 4C7 | 4C6 | 4C1 | 4C0 | 4C3 | 4C2 |
| 11 | 15 | 26B | 268 | 269 | 26E | 26F | 26C | 26D | 262 | 263 | 260 | 261 | 266 | 267 | 264 | 265 |
| 11 | 16 | 134 | 137 | 136 | 131 | 130 | 133 | 132 | 13D | 13C | 13F | 13E | 139 | 138 | 13B | 13A |
| 11 | 17 | 8CB | 8C8 | 8C9 | 8CE | 8CF | 8CC | 8CD | 8C2 | 8C3 | 8C0 | 8C1 | 8C6 | 8C7 | 8C4 | 8C5 |
| 11 | 18 | 464 | 467 | 466 | 461 | 460 | 463 | 462 | 46D | 46C | 46F | 46E | 469 | 468 | 46B | 46A |
| 11 | 19 | 23F | 23C | 23D | 23A | 23B | 238 | 239 | 236 | 237 | 234 | 235 | 232 | 233 | 230 | 231 |
| 11 | 20 | 1D6 | 1D5 | 1D4 | 1D3 | 1D2 | 1D1 | 1D0 | 1DF | 1DE | 1DD | 1DC | 1DB | 1DA | 1D9 | 1D8 |
| 11 | 21 | 86F | 86C | 86D | 86A | 86B | 868 | 869 | 866 | 867 | 864 | 865 | 862 | 863 | 860 | 861 |
| 11 | 22 | 436 | 435 | 434 | 433 | 432 | 431 | 430 | 43F | 43E | 43D | 43C | 43B | 43A | 439 | 438 |
| 11 | 23 | 2DE | 2DD | 2DC | 2DB | 2DA | 2D9 | 2D8 | 2D7 | 2D6 | 2D5 | 2D4 | 2D3 | 2D2 | 2D1 | 2D0 |
| 11 | 24 | 1AA | 1A9 | 1A8 | 1AF | 1AE | 1AD | 1AC | 1A3 | 1A2 | 1A1 | 1A0 | 1A7 | 1A6 | 1A5 | 1A4 |
| 11 | 25 | 83E | 83D | 83C | 83B | 83A | 839 | 838 | 837 | 836 | 835 | 834 | 833 | 832 | 831 | 830 |
| 11 | 26 | 4DA | 4D9 | 4D8 | 4DF | 4DE | 4DD | 4DC | 4D3 | 4D2 | 4D1 | 4D0 | 4D7 | 4D6 | 4D5 | 4D4 |
| 11 | 27 | 2A8 | 2AB | 2AA | 2AD | 2AC | 2AF | 2AE | 2A1 | 2A0 | 2A3 | 2A2 | 2A5 | 2A4 | 2A7 | 2A6 |
| 11 | 28 | 159 | 15A | 15B | 15C | 15D | 15E | 15F | 150 | 151 | 152 | 153 | 154 | 155 | 156 | 157 |
| 11 | 29 | 8D8 | 8DB | 8DA | 8DD | 8DC | 8DF | 8DE | 8D1 | 8D0 | 8D3 | 8D2 | 8D5 | 8D4 | 8D7 | 8D6 |
| 11 | 30 | 4A9 | 4AA | 4AB | 4AC | 4AD | 4AE | 4AF | 4A0 | 4A1 | 4A2 | 4A3 | 4A4 | 4A5 | 4A6 | 4A7 |
| 11 | 31 | 255 | 256 | 257 | 250 | 251 | 252 | 253 | 25C | 25D | 25E | 25F | 258 | 259 | 25A | 25B |
| 11 | 32 | 1E3 | 1E0 | 1E1 | 1E6 | 1E7 | 1E4 | 1E5 | 1EA | 1EB | 1E8 | 1E9 | 1EE | 1EF | 1EC | 1ED |
| 11 | 33 | 801 | 802 | 803 | 804 | 805 | 806 | 807 | 808 | 809 | 80A | 80B | 80C | 80D | 80E | 80F |
| 11 | 34 | 401 | 402 | 403 | 404 | 405 | 406 | 407 | 408 | 409 | 40A | 40B | 40C | 40D | 40E | 40F |
| 11 | 35 | 201 | 202 | 203 | 204 | 205 | 206 | 207 | 208 | 209 | 20A | 20B | 20C | 20D | 20E | 20F |
| 11 | 36 | 101 | 102 | 103 | 104 | 105 | 106 | 107 | 108 | 109 | 10A | 10B | 10C | 10D | 10E | 10F |
| 11 | 37 | 081 | 082 | 083 | 084 | 085 | 086 | 087 | 088 | 089 | 08A | 08B | 08C | 08D | 08E | 08F |
| 11 | 38 | 041 | 042 | 043 | 044 | 045 | 046 | 047 | 048 | 049 | 04A | 04B | 04C | 04D | 04E | 04F |
| 11 | 39 | 021 | 022 | 023 | 024 | 025 | 026 | 027 | 028 | 029 | 02A | 02B | 02C | 02D | 02E | 02F |
| 11 | 40 | 011 | 012 | 013 | 014 | 015 | 016 | 017 | 018 | 019 | 01A | 01B | 01C | 01D | 01E | 01F |

FIG. 11

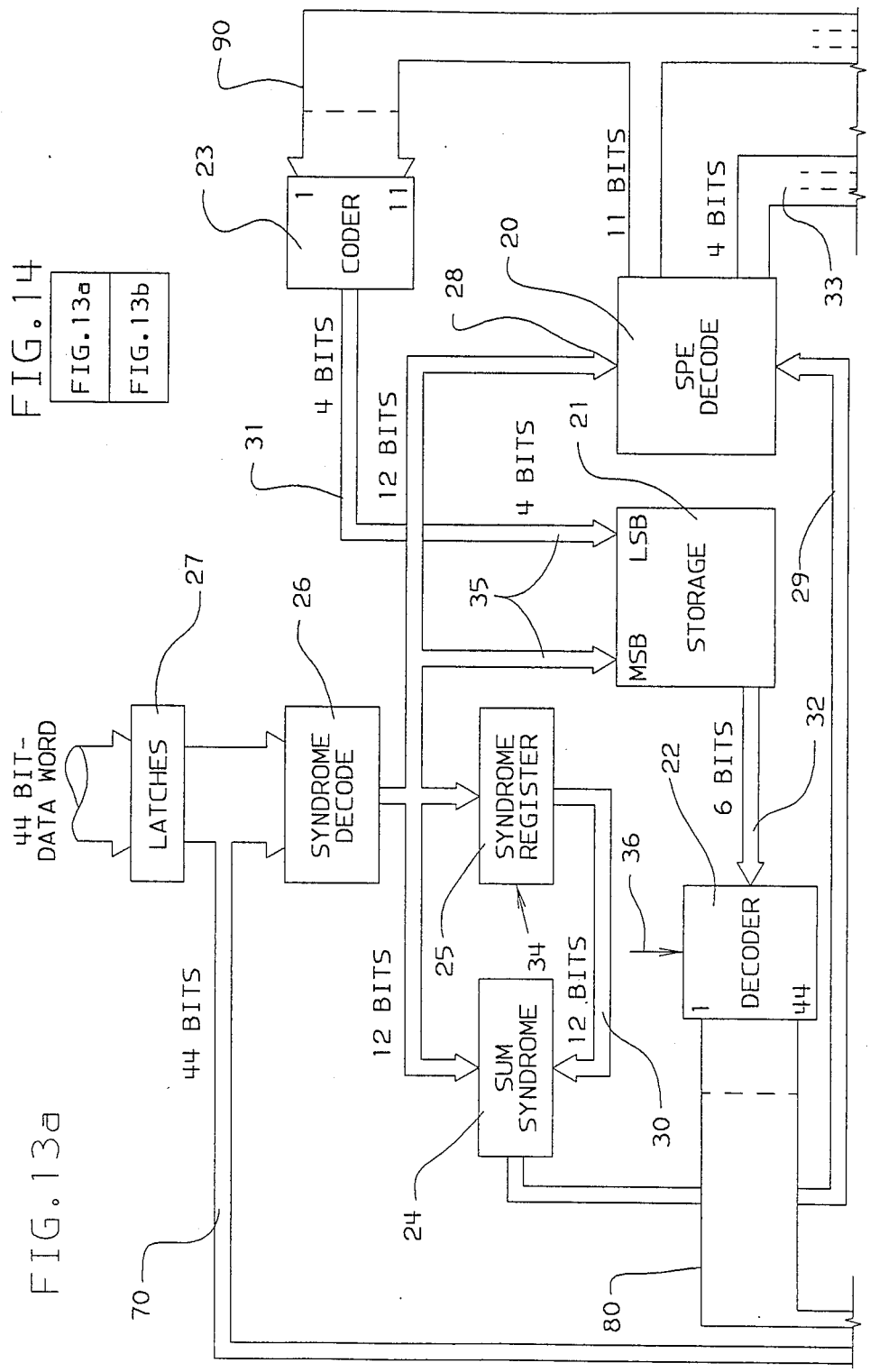

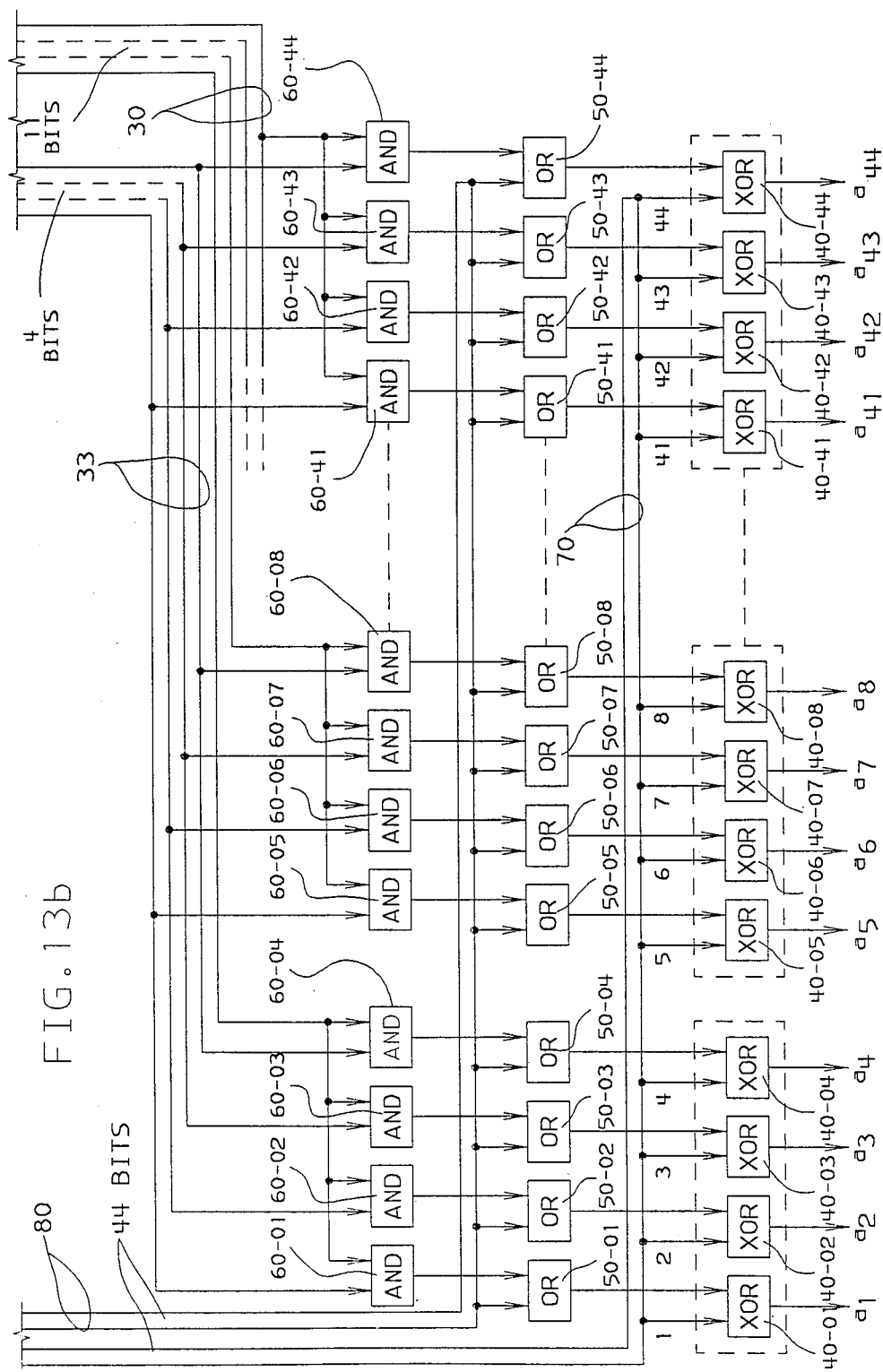

EXTENDED ERRORS CORRECTING DEVICE HAVING SINGLE PACKAGE ERROR CORRECTING AND DOUBLE PACKAGE ERROR DETECTING CODES

Technical Field of the Invention

The present invention relates generally to error correction. It relates in particular, to the correction of a soft error beyond the unextended capability of the error correction code being used.

Background Art

As the size of computer memories has increased while the individual memory cells have become further miniaturized, there has resulted an unacceptable occurrence of bit errors in data stored in a memory. No longer can an occasional error be allowed to cause a program to stop operating or require replacement of a memory chip. These bit errors are of two general types, soft errors and hard errors.

A soft error is a seemingly random inversion of stored data. This inversion is caused by occasional bursts of electrical noise and, in some cases, by atomic particles, the so-called alpha particle upset. The soft error problem has increased as the individual cell sizes have been reduced so that noise levels represent relatively low amounts of power.

A hard error, in contrast, represents a permanent electrical failure of the memory chip, often restricted to particular memory locations but also sometimes associated with peripheral circuitry of the memory chip so that the entire chip can be affected. Naturally, designers of memory chips have striven to reduce the occurrence of both hard and soft errors in their chips. However, both types of errors have not been completely eliminated and, indeed, it is not believed that they can be eliminated. Reliability beyond a certain point can be bought only at the expense of reduced performance or increased cost.

An alternative to the above solution for both hard and soft errors has been the implementation of error correction codes (ECC) in large computer memories. The fundamentals of error detecting and correcting are described by R.W. Hamming in a technical article titled "Error detecting and error correcting codes" appearing in the Bell System Technical Journal, Volume 26, No. 2, 1950 at pages 147–160. In one of the most popular Hamming codes, an 8 bit data word is encoded to a 13-bit word according to a selected Hamming code. The described code is classified as SEC/DEC (single error correct/double error detect). However, since a SEC/DED Hamming code can correct only a single random error (either soft or hard) occurring in any byte, more elaborate error correcting codes have been developed and implemented.

In particular, a better procedure has been developed for dealing with hard errors in multi-bit packages. These errors are referred to as package errors and the error correction codes designed specifically for package errors will be called package codes. The codes rely upon the fact that multiple hard errors do not randomly occur across the entire field of the data word. Instead, multiple hard errors are confined to a sub-field of the data word, defined by the outputs of the package. In the context of a 256K×4 memory chip, consisting of a 1 megabit memory chip adapted to have 4 data ports simultaneously accessible, such a code cannot correct any four errors occurring in 32 bits. However, the code can correct four-bit errors that occur in any one of eight 4-bit sub-fields.

Nonetheless, even such codes are not completely satisfactory. If the code is a SPC/DPD (single package correct/double package detect) code, then the code can correct any errors that occur in only one package and can detect, but not correct, errors occurring in two packages. Thus if one package has suffered a hard failure, the occurrence of any additional errors, either soft or hard, in the remaining packages means that the error condition can be detected but the errors cannot be corrected. The existence of one hard failure is the effective limit of correction provided by a SPC/DPD code.

In U.S. Pat. No. 4,661,955 there are cited examples of package codes and their hardware implementation in the background art. This document also discloses a digital error detection and correction apparatus particularly applicable to a code that can correct any number of errors in one sub-field but can only detect the existence of any number of errors in two sub-fields. If the initial pass of the data through the error correction code indicates an uncorrected error, the data is complemented and restored in the memory and then reread. The retrieved data is recomplemented and again passed through the error correction code. If an uncorrected error persists, then a bit-by-bit comparison is performed between the originally read data and the retrieved complemented data to isolate the hard failure in the memory. The bits in the sub-field associated with the hard failure are then sequentially changed and then the changed data word is passed through the error correction code. A wrong combination is detected by the error correction code. The sub-field associated with the hard failure matches the originally stored data, in which case the error correction code can correct the remaining errors in the remaining sub-fields. However, the successive changes of the bits in the sub-field associated with the hard failure involve a long process of iterations. Moreover, this system has the disadvantage of involving a long process of bit by bit comparisons between the originally read data and the retrieved complemented ones, numerous compare circuits and latches, and a non-fixed length correcting sequence since the originally stored data in a sub-field associated with the hard fail can be any of the 16 different combinations.

Summary of the Invention

It is an object of the invention to provide a simple and low cost extended error correcting device and method for single package error correcting and double package error detecting codes capable of correcting both a single error in one package and errors in an other package, at least one of which is a hard error.

It is an other object of the invention to provide an extending error correcting device involving a short fixed correcting sequence.

It is a further object of the invention to provide an extended error correcting device for correcting a soft error with an ECC designed to correct package error in an n-bit-per-package memory organization.

The objects of the invention are achieved by means of the digital error detection and correction apparatus of the invention for correcting n-bit data words comprising a field of n-r data bits and a field of r error-correcting-code bits according to an error correcting code.

The n-bit data words are organized in packages of b bits, and the invention is capable of correcting one package having suffered at least one hard failure and a single soft error located in a different package. The apparatus of the invention involves an error correcting code which gives a first syndrome when the data word has suffered a first error coming from at least one error in a first package and a single error in a second package different from the first package, which also gives a second syndrome when the data word has suffered a second error coming from at least one error in the above first package, and a single error in a third package. The error correcting code is such that the equality of the above first and second syndromes results in the equality of the first and second errors. The apparatus of the invention further includes means for storing the syndrome of a first data word v, and means for adding the syndrome of a second data word v', the latter data word v' being generated from the first data word v by means of an "invert write" and an "invert read" procedure. The above addition allows the masking of the single soft error. The invention further includes means for determining whether the result of the above addition provides a syndrome characterizing a single package syndrome, in order to determine the number of the package having suffered at least one hard error, and means operative in response to said determination for directly locating the positions of the errors, either soft or hard, in order to correct the originally stored data word.

Description of the Drawings

The subject matter which is regarded as the invention is particularly pointed out and distinctly claimed in the concluding portion of the specification. The invention, however, both as to organization and method of practice, together with the further objects and advantages thereof, may best be understood by reference to the following description taken in connection with the accompanying drawings in which:

FIG. 1 describes a table listing all possible syndromes that result when errors have occurred in the first package and a single bit error has occurred in an other package;

FIGS. 2 to 11 are respectively tables listing all possible syndromes that result when errors have occurred in respectively the second to the eleventh package and a single bit error has occurred in an other package;

FIGS. 13a and FIG. 13b are partial views illustrating an example of a preferred embodiment of the invention; and FIG. 14 is a view detailing the way to assemble FIGS. 13a and 13b.

Description of the Invention

Figure 12:
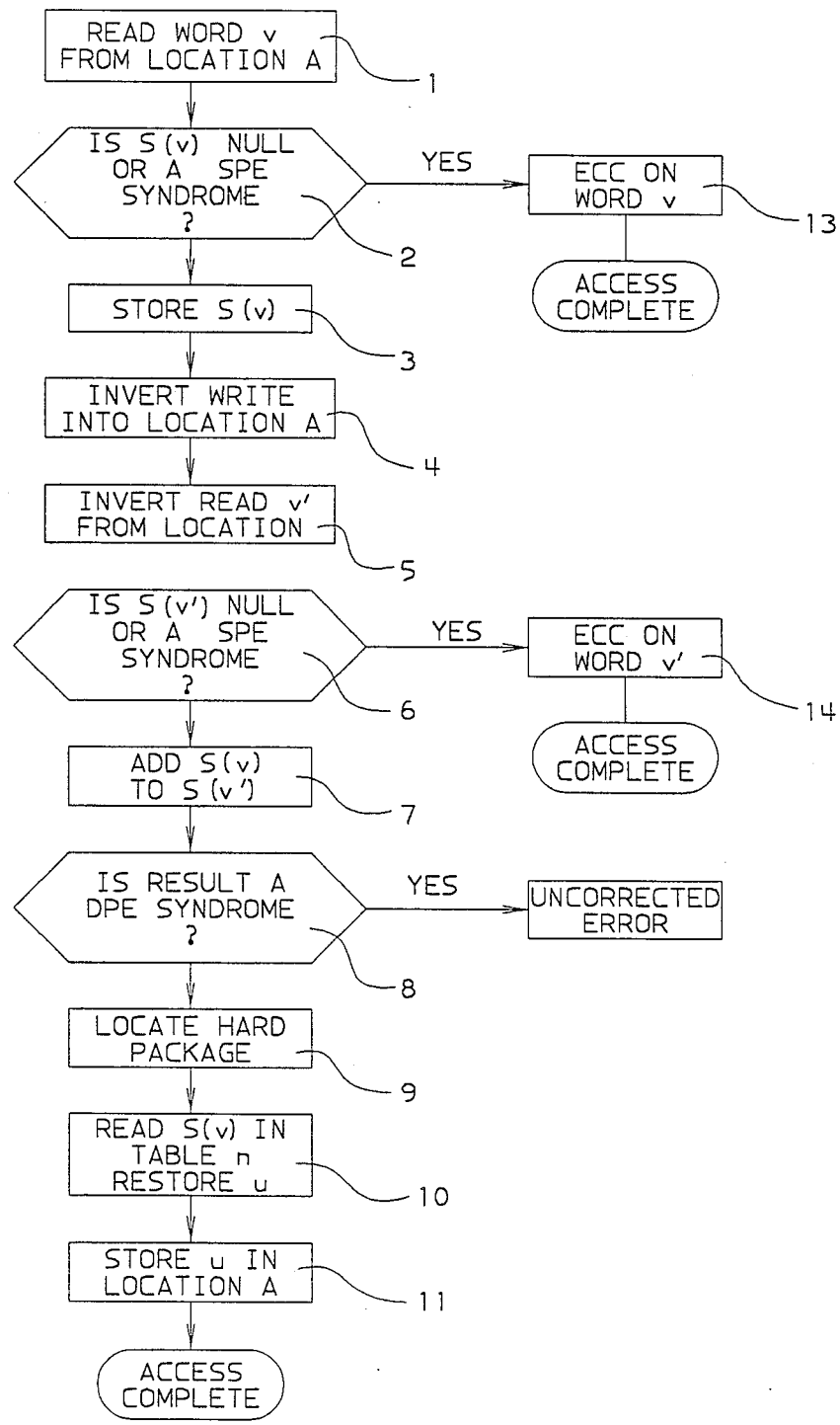
FIG. 12 is a flow chart describing the different steps involved with the error correcting system of the invention in order to correct a single soft error in the presence of a hard error.

The extended error correcting device according to the invention is based both on an "invert and retry procedure" and an analysis of the syndrome, the latter also being called the "parity check vector" or "corrector". The "invert and retry" consists in inverting the word so that the hard failure matches the electrical level to store (the hard error is masked) allowing the correction of the soft error before the word is restored with its original polarity. The "invert and retry" procedure is particularly used in the error correcting device of the invention to locate a first failed package in the word containing at least an error of the hard type. Analysis of the different syndromes eventually and immediately determine the single soft error that has occurred in a second package. Consider the following Reed-Solomon code, characterized by the r x n parity-check H matrix hereinafter, and let us illustrate an embodiment of the invention involving a 4 bit per package memory organization for 32 bit data words (r=12, n=44).

The H matrix is:

$$\begin{array}{ccccccccc|ccc} \multicolumn{9}{c|}{\text{Data bits (32 bits)}} & \multicolumn{3}{c}{+\text{ECC bits}} \\ I & I & I & I & I & I & I & I & I & O & O \\ I & T & T^2 & T^3 & T^4 & T^5 & T^6 & T^7 & O & I & O \\ I & T^2 & T^4 & T^6 & T^8 & T^{10} & T^{12} & T^{14} & O & O & I \end{array}$$

with:

$$T = \begin{array}{c} 0001 \\ 1001 \\ 0100 \\ 0010 \end{array} \quad I = \begin{array}{c} 1000 \\ 0100 \\ 0010 \\ 0001 \end{array} \quad O = \begin{array}{c} 0000 \\ 0000 \\ 0000 \\ 0000. \end{array}$$

The developed H matrix is therefore:

| | | | | PACKAGE NUMBER | | | | | | | |
|---|---|---|---|---|---|---|---|---|---|---|---|
| | 2 | 3 | 4 | 5 | 6 | 7 | 8 | 9 | 10 | 11 | COMMENTS |
| 1... | 1... | 1... | 1... | 1... | 1... | 1... | 1... | 1... | .... | .... | Bits 1–32 are |
| .1.. | .1.. | .1.. | .1.. | .1.. | .1.. | .1.. | .1.. | .1.. | .... | .... | data bits |
| ..1. | ..1. | ..1. | ..1. | ..1. | ..1. | ..1. | ..1. | ..1. | .... | .... | Bits 33–34 |
| ...1 | ...1 | ...1 | ...1 | ...1 | ...1 | ...1 | ...1 | ...1 | .... | .... | are ECC bits |
| 1... | ...1 | ..1. | .1.. | 1..1 | ..11 | .11. | 11.1 | .... | 1... | .... | |
| .1.. | 1..1 | ..11 | .11. | 11.1 | 1.1. | .1.1 | 1.11 | .... | .1.. | .... | |
| ..1. | .1.. | 1..1 | ..11 | .11. | 11.1 | 1.1. | .1.1 | .... | ..1. | .... | |
| ...1 | ..1. | .1.. | 1..1 | ..11 | .11. | 11.1 | 1.1. | .... | ...1 | .... | |
| 1... | ..1. | 1..1 | .11. | 1.1. | 1.11 | 1111 | 11.. | .... | .... | 1... | |
| .1.. | ..11 | 11.1 | .1.1 | .111 | 111. | 1... | ..1. | .... | .... | .1.. | |
| ..1. | 1..1 | .11. | 1.1. | 1.11 | 1111 | 11.. | ...1 | .... | .... | ..1. | |
| ...1 | .1.. | ..11 | 11.1 | .1.1 | .111 | 111. | 1... | .... | .... | ...1 | |
| | | 111 | 1111 | 1112 | 2222 | 2222 | 2333 | 3333 | 3334 | 4444 | Bit Index |
| 1234 | 5678 | 9012 | 3456 | 7890 | 1234 | 5678 | 9012 | 3456 | 7890 | 1234 | |

A vector $V = (a_1, a_2, a_3, \ldots a_n)$ is a code word if and only if its associated syndrome $S(v) = v \, H^T$, an r component vector, is null. In the reverse case, the preceding syndrome is not null. If a vector u, being a code word, is transmitted and v is received, the syndrome of v can be calculated by the following relation:

$S(v) = S(u) + S(v+u)$ due to the linear property of metrical operations, in which the addition table of each binary element is given in the following:

| + | 0 | 1 |
|---|---|---|
| 0 | 0 | 1 |
| 1 | 1 | 0 | this means that $S(v) = S(v+u)$ since $S(u) = 0$.

Therefore, any syndrome may be calculated from the pattern error v−u and in particular, all syndromes corresponding to single package errors.

SYNDROMES OF SINGLE PACKAGE ERRORS
(11 packages × 15 types of error possible within a package = 165)

| Package in error | Bits in Error within the package in HexaDecimal notation: | | | | | | | | | | | | | | |
|---|---|---|---|---|---|---|---|---|---|---|---|---|---|---|---|
| | 1 | 2 | 3 | 4 | 5 | 6 | 7 | 8 | 9 | A | B | C | D | E | F |
| 1 | 111 | 222 | 333 | 444 | 555 | 666 | 777 | 888 | 999 | AAA | BBB | CCC | DDD | EEE | FFF |
| 2 | 1C6 | 21C | 3DA | 421 | 5E7 | 63D | 7FB | 842 | 984 | A5E | B98 | C63 | DA5 | E7F | FB9 |
| 3 | 16D | 2C3 | 3AE | 416 | 57B | 6D5 | 7B8 | 82C | 941 | AEF | B82 | C3A | D57 | EF9 | F94 |
| 4 | 135 | 26A | 35F | 4CD | 5F8 | 6A7 | 792 | 813 | 926 | A79 | B4C | CDE | DEB | EB4 | F81 |
| 5 | 1D7 | 23E | 3E9 | 465 | 5B2 | 65B | 78C | 8CA | 91D | AF4 | B23 | CAF | D78 | E91 | F46 |
| 6 | 1AB | 2DF | 374 | 437 | 59C | 6E8 | 743 | 86E | 9C5 | AB1 | B1A | C59 | DF2 | E86 | F2D |
| 7 | 158 | 2A9 | 3F1 | 4DB | 583 | 672 | 72A | 83F | 967 | A96 | BCE | CE4 | DBC | E4D | F15 |
| 8 | 1E2 | 254 | 3B6 | 4A8 | 54A | 6FC | 71E | 8D9 | 93B | A8D | B6F | C71 | D93 | E25 | FC7 |
| 9 | 100 | 200 | 300 | 400 | 500 | 600 | 700 | 800 | 900 | A00 | B00 | C00 | D00 | E00 | F00 |
| 10 | 010 | 020 | 030 | 040 | 050 | 060 | 070 | 080 | 090 | 0A0 | 0B0 | 0C0 | 0D0 | 0E0 | 0F0 |
| 11 | 001 | 002 | 003 | 004 | 005 | 006 | 007 | 008 | 009 | 00A | 00B | 00C | 00D | 00E | 00F |

It should be noticed that these syndromes, characterizing single package errors are unique in order to indicate in an unambiguous way the package to correct and the bits in error within a package. For instance, if the evaluated syndrome S(v) has the hexadecimal value '7B8' (in binary '0111 1011 1000'), the above table reveals that the error pattern is equal to:

v+u=
0000 0000 0111 0000 0000 0000 0000 0000 0000 0000 0000.

In other words, the three last bits of the third 4-bit package have suffered an inversion, and should be reinverted in order to restore the original data word u.

Similarly, it is possible to list all syndromes that result when a package error is aligned with a single bit error in another one. The result may be listed in 11 tables, each table corresponding to a given package having suffered errors.

FIG. 1 is a table listing all possible syndromes that result when errors have occurred in the first package and a single bit error has occurred in an other package.

FIGS. 2 to 11 are tables listing all possible syndromes that result when errors have occurred in respectively the second to the eleventh package and a single bit error has occurred in an other package. Obviously, the syndromes of the double package errors listed in the tables of FIGS. 1 to 11, though they are not unique, are all differences of the syndromes of the single package errors listed above, which allows the distinction between an immediately correctable single package error and a double package error not correctable by a SPC/DPD code. However, the use of the particular H matrix above defined, in order to achieve the SPC/DPD code entails an additional advantage: within any of the tables of FIGS. 1 to 11, the syndromes of a double package errors are unique. Consequently, the knowledge of a package having suffered numerous errors, i.e. the reference number of the table of FIGS. 1 to 11, permits the additional single error, having occurred in an other package, to be located. For instance, let us suppose that double package errors have occurred in the data word, with numerous errors affecting package $n_1$. Assuming that the result of the calculation of the syndrome gives the value 'F64', the reading of table of the FIG. 1 indicates that the hexadecimal notation of the erroneous bits within package 1 is '7' ('0111' in binary), and that a single error has affected bit 13. The pattern error is then:

v+u=0111 0000 0000 1000 0000 0000 0000 0000 0000 0000 0000.

FIG. 12 is a flow chart describing the different steps involving the error correcting system of the invention in order to correct a single soft error in presence of a hard error package. A data word u, which has been encoded according to the SPC/DPD Reed-Solomon code above and stored in its proper location A in a memory, is read from the designated location A, step 1. Since this location may have suffered some failures, either soft or hard, the read word v may differ from the word u originally stored at the designated location. The syndrome S(v) corresponding to the read word v is then evaluated (step 2), and checked in order to determine whether it is null or it corresponds to a single package error (SPE). If the read word v contains no errors (S(v)=0), or if it contains errors restricted to a single package (S(v) is one among the SPE listed above), then there will be no uncorrected errors since the SPC/DPD Reed-Solomon code can immediately correct all the errors in the failed package, step 13. In this case the access is complete because either the read word v is correct or has been corrected and the corrected word v can be used. The above procedure is usual ECC processing.

If, however, there are errors in two different packages, the ECC procedure based on the SPC/DPD can only indicate the existence of this condition and cannot correct. The above evaluated syndrome S(v) is stored in order to perform the extended errors correction processing of the invention, step 3. Steps 4 and 5 are common and well known "invert write" and "invert read" procedures. Such procedures are recalled in the already cited U.S. Pat. No. 4,661,955. Basically, the read data word v is inverted to its complement value and the complemented value is then stored back into its corresponding location A, step 4. Then, the same location is read and the retrieved data word is inverted to its complemented value in order to generate a data word v′, step 5. The value of v′ should equal the value of v because of the two intervening inversions. However, if the memory has suffered a hard failure such that a bit position is stuck either high or low regardless of the input value to that bit, then v′ does not equal v. Therefore, after the steps 4 and 5, the stuck bit positions which formerly carried a wrong binary information, now carry a correct binary information, whereas the contrary occurs for those which carried correct binary information. As a result, the situations can be met wherein the number of stuck bits carrying the correct information is greater than the number of stuck bits carrying the wrong information. In such a case, the syndrome of v′, S(v′), may be found to be null or one among the single package error syndromes listed above (step 5), in which case the process progresses to step 6 in order to correct the data word v′ since the error correcting Reed-Solomon code can handle single package errors. The regenerated value of the originally stored data word u is then immediately restored in the designated location A in memory because one of the errors so detected may have been a soft error. Soft errors do not indicate a bad memory location but only that some data is temporarily inverted at that location. Once the data has been correctly restored at that location, it is highly unlikely that it will reinvert. Since soft errors may accumulate to the point that they become too numerous in any word to correct, it is advisable to correct any soft error as soon as it is detected.

If, however, the evaluated syndrome of v′ is neither null nor one among the SPE syndromes listed above, the process progresses to step 7, where the syndrome of v stored at step 3 and the the syndrome of v′ are added. Because of the following relation:

$$S(v)+S(v')=S(v+u)+S(v'+u)=S((v+u)+(v'+u)),$$

one may notice that the sum of the two syndromes S(v) and S(v′) is function of both pattern errors v+u and v′+u. Since the the "invert write" and "invert read" procedures of steps 4 and 5 do not affect any soft error, the addition of pattern errors v+u and v′+u will mask the presence of those.

Assuming for instance that the pattern error v+u is:

v+u=0101 0000 0000 1000 0000 0000 0000 0000 0000 0000 0000 which means that the received word v differs from the originally stored word u by the second, the fourth and the thirteen bit. Assuming moreover, that the three last bit of the first package are stuck (hard error package) and that the 13th bit has suffered a soft error, the processing of word v by steps 4 and 5 give a data word v′ such that its corresponding pattern error is v′+u=0010 0000 0000 1000 0000 0000 0000 0000 0000 0000 0000.

·Therefore, data word v′ differs from the originally stored word u by its third and thirteen bit. Consequently, the formerly second and fourth bits of the data word v which were wrong, have now been corrected, but conversely, the third bit, which was originally carrying the right binary information, has also been inverted. However, the process of steps 4 and 5 did not affect the validity of bit thirteen, as mentioned previously.

The addition of both preceding pattern errors v+u and v′+u will mask the soft error:

(v+u)+(v′+u)=0111 0000 0000 0000 0000 0000 0000 0000 0000 0000 0000.

Consequently, the syndrome of the sum of the two pattern errors v+u and v′+u is one among the SPE syndromes listed in the table above, the reading of which will allow the determination of the package which has suffered a hard package error. With respect to the preceding example, the evaluation of the two syndromes gives:

S(v)='D46' (hexadecimal)=1101 0100 0110 (binary)

S(v′)='A31' (hexadecimal)=1010 0011 0001 (binary)

Consequently,

S(v)+S(v′) is equal to='777' (hexadecimal)=0111 0111 0111 (binary)

The reading of the table thus indicates that the first package has suffered a hard package error, and more accurately that the three last bit positions of the first package are stuck (value '7' in hexadecimal).

According to the preceding discussion, the process performs at step 8 a test in order to determine if the sum of S(v) and S(v′) is a DPE syndrome or not. In such a case, it is assumed that the ECC had initially detected errors in three or more packages or that more than soft errors have occurred. The described embodiment is incapable of handling such situations and an uncorrected error is flagged.

If however, the sum syndrome appears to be a SPE syndrome, the process progresses to step 9 in which the location of the hard error package is achieved by reading the table given above. Then, according to the result of step 9, the syndrome of the word v is read in step 10 into one among the tables of FIGS. 1 to 11 in order to find its corresponding error pattern v+u. This allows the original data word u to be restored into the designated location A in the memory step 11, and the correct word can eventually be used.

The above process gives a satisfactory result every time a single soft error in one package coexists with errors, one of which is a hard error, confined to a second package. Now, considering the fact that the hard errors are most often located in a unique package, while the soft errors seldom affect the same data word since they are randomly located within the memory, the extended error correction device according to the invention will be able to handle most of the double package errors with only a SPC/DPD ECC. Moreover, this result is achieved without requiring a bit by bit comparison between the original read data and the retrieved complemented ones as described in U.S. Pat. No. 4,661,955. Also, no sequential change of the bits within the sub-field is needed, and the extended error correcting device of the invention involves a short fixed length correcting sequence.

FIGS. 13a and 13b are partial views illustrating an example of a preferred embodiment of the invention. FIG. 14 shows how to join those two figures. With respect to FIG. 13a, the preferred embodiment of the invention includes "SPE decode" logic 20 connected to a 12-bit-bus 28 and to a 12-bit-b-us 29. 12-bit bus 28 carries the 12-bit-syndrome evaluated by a "Syndrome Decode" circuit 26, and is connected to a first input of a "Sum Syndrome" circuit 24 and to the input of a "Syndrome Register" 25. Syndrome Register 25 is controlled by a signal line 34 and has a 12-bit-output bus 30 connected to a second input of Sum Syndrome circuit 24. 12-bit- bus 28 is also connected to the 12most significant bits (MSB) of address bus 35 of storage 21. The 4 least significant bits (LSB) of address bus 35 of storage 21 are connected through 4-bit-bus 31 to the output of coder 23. Coder 23 has an input connected to 11-bit-bus 90 which is connected to a first output of SPE decode circuit 20 and which carries the number of the package containing hard errors. SPE decode circuit 20 has a second output bus 33 which is a 4-bit-bus carrying the positions of the faulty bits in the package referenced by the value carried by 11-bit-bus 90. A set of latches 27 is used to store the 44-bit-data word v or v' extracted from location A, and has an output bus 70 connected to the input of Syndrome Decode circuit 26. The output of Sum Syndrome circuit 24 carrying the sum of the syndromes on busses 28 and 30, is connected to 12-bit-bus 29 in order to be transmitted to SPE decode circuit 20. The output of storage 21 carrying the data word corresponding to the address appearing on bus 35 (i.e. busses 28 and 31), is sent to a decoder circuit 22 via bus 32. Decoder 22 decodes the value carried by 6-bit-bus 32 and activates one among the 44 leads of a 44-bit-bus 80. Decoder 22 has control lead 36 which, when raised to a high level, blocks the 44 leads on bus 80 at a low level.

With respect to FIG. 13b, the preferred embodiment of the invention further includes a set of 44 XOR gates 44-XX (with ranging from 01 to 44), the output of each of which carries one among the 44 bits of the recovered original data word u, when the correction of the input data word v has been possible. The 44 XOR gates are divided into 11 packages of 4XOR gates, and in accordance with the division of the 44 bits of the data word into 11 packages of 4 bits illustrated above.

For clarity purpose, only XOR gates 40-01, 40-02, 40-03, 40-04, 40-05, 40-06, 40-07, 40-08, 40-41, 40-42, 40-43, 40-44 (first, second and eleventh package) have been represented. Every XOR gate 40-XX (with XX=01 to 44) has a first input connected to the XX$^{th}$ lead of 44-bit-bus 70 carrying the input data word v or v' as will be described hereinafter. For instance, XOR gate 40-01 has its first input connected to the first lead of bus 70. Similarly, XOR gate 40-44 has its first input connected to the 44$^{th}$ lead of bus 70. Every XOR gate 40-XX (with XX=01 to 44) has a second input connected to the output of an OR gate 50-XX (with XX=01 to 44). For instance, XOR gate 40-01 has its second input connected to the output of OR gate 50-01. Also, XOR gate 40-42 has its second input connected to the output of OR gate 50-42. Every OR gate 50-XX (with XX=01 to 44) has a first input connected to the XX$^{th}$ lead of 44-bit-bus 80 carrying the decoded output of storage 21. For instance, OR gate 50-01 has its first input connected to the first lead of bus 80. Similarly, OR gate 50-41 has its first input connected to the 41th lead of bus 80.

Every OR gate 50-XX (with XX=01 to 44) has a second input connected to the output of an AND gate 60-XX ( with XX=01 to 44). For instance, OR gate 50-01 has its second input connected to the output of AND gate 60-01. Also, OR gate 50-42 has its second input connected to the output of AND gate 60-42. Similar to the above, the 44 AND gates are divided into 11 packages of 4 AND gates each. (For instance, the first package comprises gates 60-01, 60-02, 60-03 and 60-04 or the third package comprises gates 60-09, 60-10, 60-11 and 60-12...). All AND gates 60-XX, 60-(XX+1), 60-(XX+2), 60-(XX+3) (with XX=4*n+1 with n=0 to 10) of a given package among the 11 possible packages, have their first input connected together to the n$^{th}$ lead of 11-bit bus 90 controlled by SPE decode circuit 20 (as shown in FIG. 13a). For instance AND gates 60-01, 60-02, 60-03, 60-14 of the first package have their first input connected together to the first lead of bus 90. Every AND gate 60-XX (with XX=1 to 41 modulo 4) has a second second input connected to the first lead of 4-bit bus 33 carrying the value of the bits to correct within the hard error package determined by the value carried on bus 90.

Every AND gate 60-XX (with XX=2 to 42 modulo 4) has a second second input connected to the second lead of 4-bit bus 33.

Every AND gate 60-XX (with XX=3 to 43 modulo 4) has a second second input connected to the third lead of 4-bit bus 33.

Every AND gate 60-XX (with XX=4 to 44 modulo 4) has a second second input connected to the fourth lead of 4-bit bus 33.

Storage 21 is typically a Read Only Storage (ROS) memory which, when addressed by a word consisting of both the syndrome S(v) and a 4-bit word representative of the number of the hard error package, delivers a 6-bit data word allowing the control of OR gates 50-XX (with XX=01 to 44) via decoder 22. In this way, the reading of the tables of FIGS. 1 to 11 is immediate, and is implemented advantageously. However, it should be noticed that the reading of those tables can be achieved by means of other well known techniques, such as the use of a programmable logic array (PLA), or some combinatory logic. Particularly, storage 21 has been programmed in such a way that any SPE syndrome, or null syndrome appearing on bus 28, i.e. the 12 most significant bits of address bus 35, entails the extraction of a 6-bit word that sets all leads of bus 80 to a low level.

The extended error correction device according to the invention operates in the following way: The data word v extracted from its designated location is first stored in the set of latches 27. Syndrome Decode circuit 26 evaluates, from the 44-bit data word v, a 12-bit syndrome S(v). Syndrome Decode circuit 26 basically comprises combinatory logic which is well known to a person skilled in the art. Control line 34 is raised to a high level which entails the storage of the syndrome into syndrome register 25. SPE decode circuit 20 receiving the value of S(v) on 12-bit bus 28, decodes S(v) in order to determine whether S(v) is null or one among the SPE syndromes listed above, according to step 2 of FIG. 12.

If S(v) is found to be null, SPE decode circuit 20 generates a low level on each lead of bus 90 in order to put every AND gate 60-XX (with XX=01 to 44) at a low level. The appearance of an SPE syndrome at the most significant bits of address bus of storage 21 entails, as mentioned previously, the extraction of a 6-bit data word on bus 32 which sets all lines of the 44-bit bus 80 to a low level. In this case, control lead 36 is set to a low level. Consequently, every OR gate 50-XX (with XX=01 to 44) is set to a low level and the input data word v carried by bus 70 and recognized to be without any error, is transmitted to the output of error correcting device via XOR gates 40-XX (with XX=01 to 44). If S(v) is found to be one among the SPE syndromes listed above, SPE decode circuit 20 generates a high level on the line of bus 90 which corresponds to the package having suffered a failure, thus activating the first inputs of all of the AND gates of the package corresponding to the designated failed package. Similarly, SPE Decode circuit 20 activates on bus 33, the lines corresponding to the position of the bits within the failed package which should be re-inverted in order to restore the original data word u. The AND gates associated with the positions of the bits carrying wrong information are consequently set to a high level. Since the most significant bits of address bus 35 carry an SPE syndrome, as previously, a 6-bit word is extracted from storage 21 which set to a low level all leads of bus 80, and thus the first input of every OR gate 50-XX (with XX =01 to 44). The OR gates corresponding to the positions of the bits within the failed package which should be re-inverted are consequently set to a high state. This results in the final inversion of the corresponding bits by means of the corresponding XOR gates.

With respect to a preceding example, if the syndrome of the input data word v is equal to '7B8' (the preceding table indicates that the third package has suffered an error, and particularly, the last three bits of this package), SPE Decode circuit 20 raises the third line of bus 90 which prevents the activation of any AND gate 60-XX excepting those of package 3, i.e. AND gates 60-09, 60-10, 60-11 and 60-12. SPE Decode circuit 20 also activates lines 2, 3 and 4 of bus 33, which sets AND gates 60-10, 60-11 and 60-12 to a high state. Since the most significant bits of address bus 35 carries the value of an SPE syndrome, the data extracted from storage 21 on 6-bit bus 32 is such that any lead of bus 80 is set to a low level. Therefore, only OR gates 50-10, 50-11 and 50-12 are set to a high level, which allows the inversion of bits 10, 11 and 12 of the input data word v by means of XOR gates 40-10, 40-11 and 40-12.

If the evaluated syndrome S(v) is not null nor included in the table above, the already mentioned "invert write" and "invert read" procedures are performed according to steps 4 and 5 of FIG. 12. The resulting data word v' is transmitted to the input of latches 27, the syndrome of which is evaluated by Syndrome Decode circuit 26. Control line 34 is set to a low level, which prevents the storage of the new syndrome into Syndrome Register 25. Decode circuit 20 receiving this new syndrome S(v') on bus 28 determines whether S(v') is null or one among the SPE syndromes listed above.

If S(v') is found to be null, SPE Decode circuit 20 generates a low level on each line of bus 90 in order to put every AND gate 60-XX (with XX=01 to 44) at a low level. Since control lead 36 is set at a high level, all leads of the 44-bit bus 80, and thus the first input lead of every OR gate 50-XX, are set to a low level. Consequently, every OR gate 50-XX (with XX=01 to 44) is set to a low level and the input data word v' carried by bus 70 and recognized to be without any error, is transmitted to the output of the error correcting apparatus via XOR gates 40-XX ( with XX=01 to 44).

If S(v') is found to be one among the SPE syndromes listed above, SPE Decode circuit 20 generates a high level on the line of bus 90 which corresponds to the package having suffered a failure, thus activating the first inputs of all the AND gates of the package corresponding to the designated failed package. Similarly, SPE Decode circuit 20 activates, on bus 33, the lines corresponding to the position of the bits within the failed package which should be re-inverted in order to correct the word v' and to restore the original data word u. The AND gates associated with the positions of the bits carrying wrong information are consequently set to a high level. Since control line 36 remains at a high level, every line of bus 80 and consequently every first input of OR gate 50-XX (with XX =01 to 44), is set to a low level. As a result, the OR gates corresponding to the positions of the bits carrying wrong binary information are set to a high level, thus resulting in the inversion of the corresponding bits by means of the associated XOR gates. It should be noted that the signal existing on control line 36 can be generated by a simple sequential logic circuit or other control logic circuitry which is well known in the art.

This completes the ECC processing upon the word v' according to step 14 of FIG. 12.

If S(v') appearing on bus 28, is neither equal to one among the SPE syndromes nor null, SPE Decode circuit 20 reads the value of the sum of syndromes S(v) and S(v') on bus 29 according to step 7 of FIG. 12. If the value carried on bus 29 is not one among the SPE syndromes, the process is completed by flagging an uncorrectable error according to step 8 of FIG. 12, since the invention is incapable of handling such situations.

If S(v') +S(v) is found to be one among the SPE syndromes listed above, SPE Decode circuit 20 generates a high level on the line of bus 90 which corresponds to the package having suffered a hard failure, thus activating the first inputs of all the AND gates of the package corresponding to the designated failed package. SPE Decode circuit 20 sets at a low level every line of bus 33, thus blocking every AND gate 60-XX (with XX =01 to 44)-. Control line 36 is set to a low level. Consequently, Decoder 22 controls every line of bus 80 according to the content of the 6-bit data word extracted from storage 21. Since the least significant bits of address bus 35 carry the number of the faulty package, and since the most significant bits of address bus 34 carries the value of the evaluated syndrome S(v'), the storage can immediately deliver via bus 80, the position of the bits to invert in order to correct the data word v' and to restore the original data word u.

While the preferred embodiment of the invention has been particularly described with respect to the preceding particular Reed-Solomon code, it should be noticed that the invention is not restricted to that case. The size of the data word, a 44 bit size, can easily be extended. For instance, 72-bit data words having 60 (15×4) data bits and 12 (3×4) ECC bits. In such a case, the uniqueness of the syndromes of a single package error associated with a single bit error is still assured for a given faulty package number.

A different way of generating a Reed-Solomon code is to use another T matrix. It should be noticed that the T matrix must be the companion matrix of a primitive element of a Galois Field $GF(2^b)$. The case described above was with respect to the companion matrix with b=4. In particular, the following T matrix may be used:

0001
1000
0100

-continued

|0011|
|---|

The extended error correcting device of the invention may also be implemented with a different b value, for instance with b=3. As for b=4, only two distinctive T matrices, and thus two distinctive H matrices can e used (30,21). Those two T matrices are:

$$T = \begin{matrix} 0 & 0 & 1 \\ 1 & 0 & 1 \\ 0 & 1 & 0 \end{matrix} \text{ and } T = \begin{matrix} 0 & 0 & 1 \\ 1 & 0 & 0 \\ 0 & 1 & 1 \end{matrix}$$

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A digital error detection and correction apparatus for correcting an n-bit data word stored in a memory of an information processing system, said data word comprising a field of n-r data bits and a field of r error correcting code bits according to an error correcting code, said n-bit data words being organized in packages of b bits, said code being capable of correcting at least one error in one package having suffered at least one hard failure and a single soft error in a different package, said apparatus comprising:

syndrome generating means in which said error correcting code produces a first syndrome upon the condition that said data word suffers a first error due to at least one error in a first package and a single error in a second package, said second package being different from said first package, and in which said code produces a second syndrome upon the condition that said data word suffers a second error due to at least one error in said first package and a single error in a third package, said syndrome generating means also being responsive to an error correcting code in which the equality of said first and second syndromes results in the equality of said first and second errors;

means for storing the syndrome of a first data word v read from said memory;

means for adding the syndrome of a second data word v' to said first syndrome, said second data word v' being generated from said first data word v by means of an invert write and an invert read procedure in said memory, said addition providing a result which is independent of the position of said soft error;

means for determining whether the result of said addition provides a syndrome of the single package type, in order to determine the specific package which has suffered at least one hard error; and means responsive to said determination for directly locating the positions of the errors, and for correcting the data word.

2. A digital error detection and correction apparatus according to claim 1 further including:

storage means having an address bus which has a first field receiving the value of the result of said addition, and a second field receiving the value of the number of the package having suffered at least a hard error;

said storage generating, in response to a given address, a data word representative of the position of at least one erroneous bit.

3. A digital error detection and correction apparatus according to claim 2 further including:

a set of XOR gates each of said XOR gates having a first input connected to one bit of the data word to be corrected; and means controlled by said data bus of said storage in order to produce an inversion of a determined bit, the position of which has suffered one error, through a bit position correction signal supplied to a second input of said XOR gates.

4. A digital error detection and correction apparatus according to claim 1 in which said error correcting code is a Reed-Solomon code having an H matrix of the type:

| I | I | I | I | I | I | I | I | I | O | O |
|---|---|---|---|---|---|---|---|---|---|---|
| I | T | $T^2$ | $T^3$ | $T^4$ | $T^5$ | $T^6$ | $T^7$ | O | I | O |
| I | $T^2$ | $T^4$ | $T^6$ | $T^8$ | $T^{10}$ | $T^{12}$ | $T^{14}$ | O | O | I, | with I being an identity matrix, O being a null matrix and with T being a companion matrix of a primitive element of a Galois Field $GF(2^b)$.

5. A digital error detection and correction apparatus according to claim 4 in which said T matrix is of the type:

|0001|
|---|
|1000|
|0100|
|0011.|

6. A digital error detection and correction apparatus according to claim 4 in which said T matrix is of the type:

|0001|
|---|
|1001|
|0100|
|0010.|

7. A digital error detection and correction apparatus according to claim 4 in which said T matrix is of the type:

|0 0 1|
|---|
|1 0 1|
|1 0.|

8. A digital error detection and correction apparatus according to claim 4 in which said T matrix is of the type:

9. A digital error detection and correction apparatus according to claim 1 in which said data word comprises a field of 32 data bits and a second field of 12 ECC bits.

|0 0 1|
|---|
|1 0 0|
|0 1 1.|

10. A method for digital error detection and correction for an n-bit data word stored in a memory of an information processing system, said data word comprising a field of n-r data bits and a field of r error correcting code bits according to an error correcting code, said n-bit data word being organized in packages of b bits, said code being capable of correcting at lease one error in one package having suffered at least one hard failure and a single soft error in a different package, said method comprising the steps of:
  generating with said code a first syndrome when said data word has suffered a first error coming from at least one error in a first package and a single error in a second package, said second package being different from said first package, said code giving a second syndrome when said data word has suffered a second error coming from at least one error in said first package and a single error in a third package, said error correcting code also being such that the quality of said first and second syndromes results in the equality of said first and second errors:
  storing the syndrome of a first word v read from said memory;
  adding the syndrome of a second data word v' to the syndrome of word v, said word v' being generated from said data word v by means of an invert-write and an invert-read memory operation, said addition providing a result which is independent of the position of said soft error;
  determining whether the result of said addition provides a syndrome of the single package type, in order to determine the specific package which has suffered a hard error; and
  determining the positions of errors at least in said specific package and correcting the data word.

11. The method of claim 10 in which said first determining step is carried out with a storage means having an address bus which has a first field receiving the value of the result of said addition, and a second field receiving the value of the number of the package having suffered at least a hard error, said storage means generated, in a response to a given address, a data word representative of the position of at least one erroneous bit.

12. The method of claim 11 in which said error correcting code is a Reed-Solomon code having an H matrix of the type:

| I | I | I | I | I | I | I | I | O | O |
|---|---|---|---|---|---|---|---|---|---|
| I | T | $T^2$ | $T^3$ | $T^4$ | $T^5$ | $T^6$ | $T^7$ | O | I | O |
| I | $T^2$ | $T^4$ | $T^6$ | $T^8$ | $T^{10}$ | $T^{12}$ | $T^{14}$ | O | O | I, | with I being an identity matrix, O being a null matrix and with T being a companion matrix of a primitive element of a Galois Field $GF(2^b)$.

13. The method of claim 12 in which said T matrix is of the type:

0001
1000
0100
0011.

14. The method of claim 13 in which said T matrix is of the type:

0001
1001
0100
0010.

15. The method of claim 14 in which said data word comprises a field of 32 data bits and a second field of 12 ECC bits.

16. The method of claim 15 in which said T matrix is of the type:

0 0 1
1 0 1
0 1 0.

17. The method of claim 16 in which said T matrix is of the type:

0 0 1
1 0 0
0 1 1.

* * * * *